US012660443B2

(12) United States Patent (10) Patent No.: US 12,660,443 B2
Ding et al. (45) Date of Patent: Jun. 16, 2026

(54) DISPLAY SUBSTRATE, PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yanhong Ding, Beijing (CN); Hui Lu, Beijing (CN); Bin Liu, Beijing (CN); Yipeng Chen, Beijing (CN); Jiandong Bao, Beijing (CN); Tao Gao, Beijing (CN); Lang Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 502 days.

(21) Appl. No.: 18/033,078

(22) PCT Filed: May 31, 2022

(86) PCT No.: PCT/CN2022/096462

§ 371 (c)(1),
(2) Date: Apr. 21, 2023

(87) PCT Pub. No.: WO2023/230912

PCT Pub. Date: Dec. 7, 2023

(65) Prior Publication Data

US 2024/0381709 A1 Nov. 14, 2024

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ..... H10K 59/131; H10K 59/35; H10D 86/441
See application file for complete search history.

(56) References Cited

U.S. PATENT DOCUMENTS 11,069,302 B2 7/2021 Lee
2019/0123119 A1* 4/2019 Miyamoto ........... H10D 86/451
(Continued)

FOREIGN PATENT DOCUMENTS

CN 105867035 A 8/2016
CN 106057820 A 10/2016
(Continued)

*Primary Examiner* — Yuzhen Shen
(74) *Attorney, Agent, or Firm* — Ling Wu; Stephen Yang; Ling and Yang Intellectual Property

(57) ABSTRACT

Disclosed are a display substrate, a preparation method therefor and a display apparatus. The display substrate includes a shielding conductive layer and a functional structure layer, wherein the shielding conductive layer at least includes a first connection line, and the functional structure layer at least includes a data signal line and a second connection line; in a plane parallel to the display substrate, the display substrate includes a plurality of circuit units forming a plurality of unit rows and a plurality of unit columns, at least one circuit unit includes a pixel driving circuit, the data signal line is connected to a plurality of pixel driving circuits of one unit column, the data signal line is configured to provide a data signal to the pixel driving circuit; the second connection line is connected with the first connection line, and the data signal line is connected with the second connection line.

18 Claims, 23 Drawing Sheets

(56)              References Cited

U.S. PATENT DOCUMENTS

| | | | |
|---|---|---|---|
| 2019/0278145 A1 | 9/2019 | Tanaka et al. | |
| 2020/0203468 A1* | 6/2020 | Zeng | H10K 59/122 |
| 2021/0280567 A1 | 9/2021 | Lin et al. | |
| 2021/0280609 A1* | 9/2021 | An | H10D 86/60 |
| 2022/0123094 A1 | 4/2022 | Qiu et al. | |
| 2022/0384558 A1 | 12/2022 | Xu et al. | |
| 2023/0043145 A1 | 2/2023 | Yuan et al. | |
| 2023/0090817 A1* | 3/2023 | Cha | H10K 59/1315 257/211 |
| 2023/0189590 A1* | 6/2023 | Choi | H10K 59/00 |

FOREIGN PATENT DOCUMENTS

| | | | |
|---|---|---|---|
| CN | 106653722 A | 5/2017 | |
| CN | 109791745 A | 5/2019 | |
| CN | 111326560 A | 6/2020 | |
| CN | 111653603 A | 9/2020 | |
| CN | 112310125 A | 2/2021 | |
| CN | 113327516 A | 8/2021 | |
| CN | 113870713 A | 12/2021 | |
| CN | 114171574 A | 3/2022 | |
| CN | 114220834 A | 3/2022 | |
| CN | 114497151 A | 5/2022 | |
| EP | 3992705 A1 | 5/2022 | |

* cited by examiner (N-2)th column   (N-1)th column   Nth column   (N+1)th column   (N+2)th column

X

Y

T1

T4

T2

T3

Mth row

T6

T5

T7

71   (M+1)th row

71

31

32

34    33

(N-2)th column    (N-1)th column    Nth column    (N+1)th column    (N+2)th column

X
Y

T1

T8

T2

T3

T4

Mth row

T6

T5

T7

(M+1)th row

71

71

42

41

DISPLAY SUBSTRATE, PREPARATION METHOD THEREFOR, AND DISPLAY APPARATUS

CROSS-REFERENCE TO RELATED APPLICATIONS

The present application is a U.S. National Phase Entry of International Application PCT/CN2022/096462 having an international filing date of May 31, 2022, and the contents disclosed in the above-mentioned application are hereby incorporated as a part of this application.

TECHNICAL FIELD

The present disclosure relates to, but is not limited to, the field of display technologies, and particularly to a display substrate, a preparation method therefor, and a display apparatus.

BACKGROUND

An Organic Light Emitting Diode (OLED for short) and a Quantum-dot Light Emitting Diode (QLED for short) are active light emitting display devices and have advantages such as self-luminescence, a wide viewing angle, a high contrast ratio, low power consumption, extremely high response speed, lightness and thinness, flexibility, and low cost. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate including a shielding conductive layer disposed on a base substrate and a functional structure layer disposed on a side of the shielding conductive layer away from the base substrate, the shielding conductive layer at least including a first connection line, the functional structure layer at least including a data signal line and a second connection line; in a plane parallel to the display substrate, the display substrate includes a plurality of circuit units forming a plurality of unit rows and a plurality of unit columns, at least one circuit unit includes a pixel driving circuit, the data signal line is connected with a plurality of pixel driving circuits of one unit column, the data signal line is configured to provide a data signal to the pixel driving circuit; the second connection line is connected with the first connection line, and the data signal line is connected with the second connection line.

In an exemplary implementation mode, the functional structure layer includes a plurality of conductive layers, the second connection line and the data signal line are disposed in different conductive layers, the second connection line is connected with the first connection line through a first lap via, and the data signal line is connected with the second connection line through a second lap via.

In an exemplary implementation mode, in a plane parallel to the display substrate, the display substrate includes a display region and a bonding region located on a side of the display region in a second direction, the bonding region at least includes a lead line; a first end of the first connection line is connected with the lead line, after a second end of the first connection line extends to the display region, the second end of the first connection line is connected with a first end of the second connection line through the first lap via, after a second end of the second connection line extends in the first direction, the second end of the second connection line is connected with the data signal line through the second lap via, and the first direction intersects the second direction.

In an exemplary implementation mode, an end of the first connection line close to the second connection line is provided with a first connection block, the orthographic projection of the first connection block on the base substrate at least partially overlaps the orthographic projection of the second connection line on the base substrate, and the second connection line is connected with the first connection block through the first lap via.

In an exemplary implementation mode, an end of the second connection line close to the first connection line is provided with a second connection block, the orthographic projection of the second connection block on the base substrate at least partially overlaps the orthographic projection of the first connection line on the base substrate, and the second connection block is connected with the first connection line through the first lap via.

In an exemplary implementation mode, an end of the first connection line close to the second connection line is provided with a first connection block, the orthographic projection of the first connection block on the base substrate at least partially overlaps the orthographic projection of the second connection block on the base substrate, and the second connection block is connected with the first connection block through the first lap via.

In an exemplary implementation mode, the second connection line at least includes a first sub-line, a second sub-line, a third sub-line and a fourth sub-line, a first end of the first sub-line is connected with a second end of the first connection line, after a second end of the first sub-line extends in the direction of the unit column, the second end of the first sub-line is connected with a first end of the second sub-line, after a second end of the second sub-line extends in the direction of the unit row, the second end of the second sub-line is connected with a first end of the third sub-line, after a second end of the third sub-line extends in the direction of the unit column, the second end of the third sub-line is connected with a first end of the fourth sub-line, and after a second end of the fourth sub-line extends in the direction of the unit row, the second end of the fourth sub-line is connected with the data signal line.

In an exemplary implementation mode, the first sub-line is disposed between adjacent unit columns.

In an exemplary implementation mode, the second sub-line has a shape of a bending line extending in the direction of the unit row, and the second sub-line includes at least one protruding segment protruding toward the direction of the bonding region.

In an exemplary implementation mode, the third sub-line is disposed between adjacent unit columns.

In an exemplary implementation mode, the pixel driving circuit at least includes a data writing transistor, the functional structure layer also includes a first electrode of the data writing transistor, in at least one circuit unit, the fourth sub-line is connected with the first electrode of the data writing transistor, and the data signal line is connected with the first electrode of the data writing transistor through the second lap via.

In an exemplary implementation mode, the fourth subline and the first electrode of the data writing transistor are disposed in a same layer and are interconnected to be of an integral structure.

In an exemplary implementation mode, the functional structure layer further includes a first initial signal line configured to provide a first initial signal to the pixel driving circuit, and the orthographic projection of the second subline on the base substrate at least partially overlaps the orthographic projection of the first initial signal line on the base substrate.

In an exemplary implementation mode, the first connection line is disposed between adjacent unit columns.

In an exemplary implementation mode, the shielding conductive layer further includes a shielding electrode disposed in the circuit unit and a first shielding connection line connected to a plurality of shielding electrodes in one unit column.

In an exemplary implementation mode, the shielding conductive layer includes a first titanium layer having a thickness of 40 nm to 60 nm, an aluminum layer having a thickness of 250 nm to 550 nm, and a second titanium layer having a thickness of 20 nm to 40 nm, which are stacked.

In an exemplary implementation mode, the pixel driving circuit includes a storage capacitor and a plurality of transistors; in a plane perpendicular to the display substrate, the functional structure layer at least includes a first conductive layer, a second conductive layer, a third conductive layer, a fourth conductive layer and a fifth conductive layer disposed on a side of the shielding conductive layer away from the base substrate, the first conductive layer at least includes a first plate of the storage capacitor and gate electrodes of the plurality of transistors, the second conductive layer at least includes a second plate of the storage capacitor, the fourth conductive layer at least includes the second connection line, and the fifth conductive layer at least includes the data signal line.

In an exemplary implementation mode, the plurality of transistors include at least one polysilicon transistor and at least one oxide transistor, the functional structure layer further includes a first semiconductor layer and a second semiconductor layer, the first semiconductor layer is disposed between the shielding conductive layer and the first conductive layer, the first semiconductor layer includes an active layer of the polysilicon transistor, and the second semiconductor layer is disposed between the second conductive layer and the third conductive layer, the second semiconductor layer includes an active layer of the oxide transistor.

In another aspect, the present disclosure further provides a display apparatus, including the aforementioned display substrate.

In yet another aspect, the present disclosure also provides a preparation method of a display substrate, in a plane parallel to the display substrate, the display substrate includes a plurality of circuit units forming a plurality of unit rows and a plurality of unit columns, at least one circuit unit includes a pixel driving circuit, the preparation method including:

Forming a shielding conductive layer on a base substrate, wherein the shielding conductive layer at least includes a first connection line;

Forming a functional structure layer on the shielding conductive layer, the functional structure layer at least includes a second connection line and a data signal line, the data signal line is connected to a plurality of pixel driving circuits of one unit column, the data signal line is configured to provide a data signal to the pixel driving circuits, the second connection line is connected to the first connection line, and the data signal line is connected to the second connection line.

Other aspects may be understood upon reading and understanding the drawings and detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Figure 1:
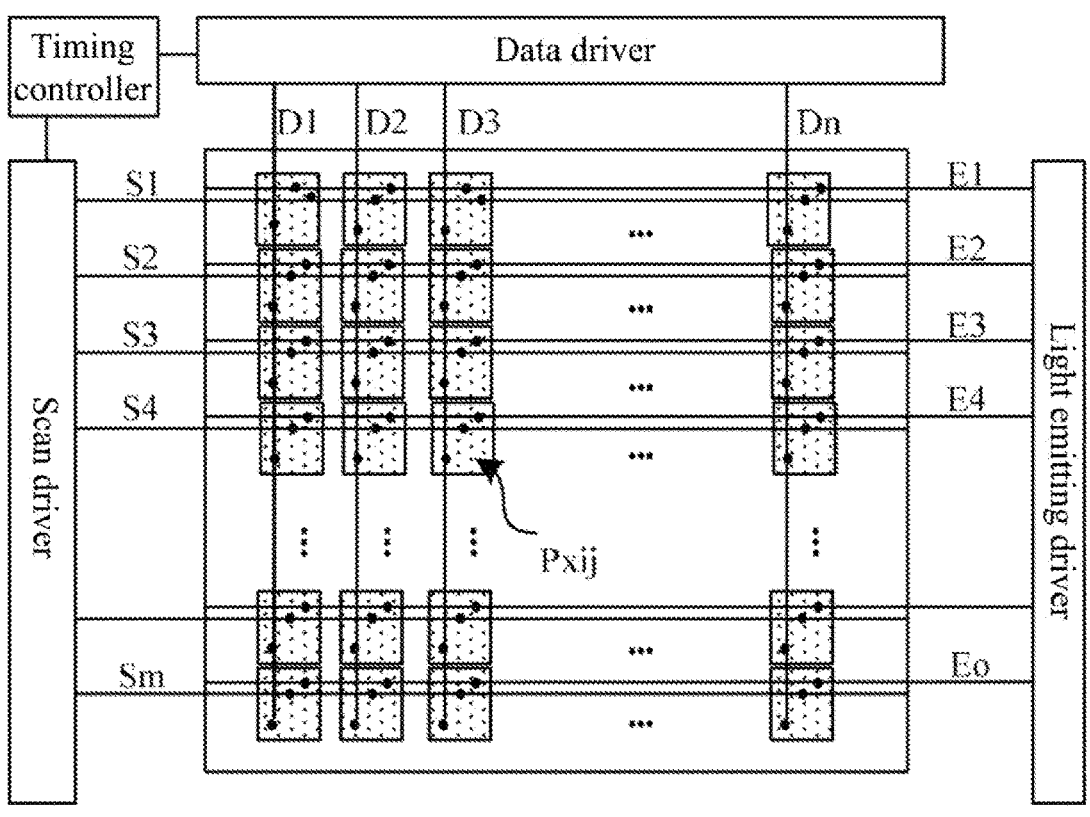
FIG. 1 is a schematic diagram of a structure of a display apparatus.

with reference to the drawings, and are merely for facilitating the description of the specification and simplifying the description, rather than indicating or implying that a referred apparatus or element must have a particular orientation and

| Description of reference signs: | | |
| --- | --- | --- |
| 11-first active layer; | 12-second active layer; | 13-third active layer; |
| 14-fourth active layer; | 15-fifth active layer; | 16-sixth active layer; |
| 17-seventh active layer; | 18-eighth active layer; | 21-first scan signal line |
| 22-second scan signal line | 23-light emitting control line; | 24-first plate; |
| 31-third shielding connection line; | 32-second plate; | 33-plate connection line; |
| 34-opening; | 41-third scan signal line; | 42-first initial signal line; |
| 51-first connection electrode; | 52-second connection electrode; | 53-third connection electrode; |
| 54-fourth connection electrode; | 55-fifth connection electrode; | 56-sixth connection electrode; |
| 57-second initial signal line; | 60-data signal line; | 61-anode connection electrode; |
| 62-first power supply line; | 70-data connection line; | 71-first connection line; |
| 72-second connection line; | 80-shielding electrode; | 81-first shielding connection line; |
| 82-second shielding connection line; | 100-display region; | 101-base substrate; |
| 102-drive circuit layer; | 103-light emitting structure layer; | 104-encapsulation structure layer; |
| 200-bonding region; | 210-lead region; | 220-lead line; |
| 300-bezel region; | 301-anode; | 302-pixel definition layer; |
| 303-organic light emitting layer; | 304-cathode; | 401-first encapsulation layer; |
| 402-second encapsulation layer; | 403-third encapsulation layer. | |

DETAILED DESCRIPTION

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode"

are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc. In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected with the data driver, the scan driver and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include multiple sub-pixels Pxij, wherein i and j may be natural numbers. At least one sub-pixel Pxij may include a circuit unit and a light emitting device connected to the circuit unit, and the circuit unit may include a pixel driving circuit which is connected with the scan signal line, the light emitting signal line and a data signal line. In an exemplary implementation mode, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate a data voltage to be provided to the data signal lines D1, D2, D3, . . . and Dn by using the grayscale value and the control signal that are received from the timing controller. For example, the data driver may sample the gray tone value by using the clock signal and apply a data voltage corresponding to the gray tone value to the data signal lines D1 to Dn by taking a unit row as a unit, wherein n may be a natural number. The scan driver may receive the clock signal, the scan start signal and the like from the timing controller to generate a scan signal to be provided to the scan signal lines S1, S2, S3, . . . and Sm. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light emitting driver may receive the clock signal, the emission stop signal and the like from the timing controller to generate an emission signal to be provided to the light emitting signal lines E1, E2, E3, . . . and Eo. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
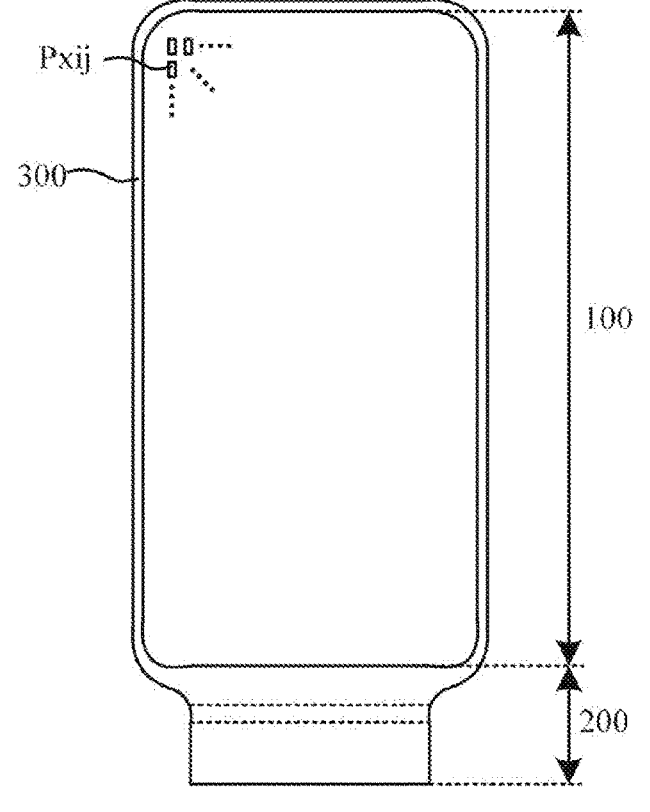
FIG. 2 is a schematic diagram of a structure of a display substrate.

FIG. 2 is a schematic diagram of a structure of a display substrate. As shown in FIG. 2, the display substrate may include a display region 100, a bonding region 200 at a side of the display region 100, and a bezel region 300 at other sides of the display region 100. In an exemplary implementation mode, the display region 100 may be a planar region including a plurality of sub-pixels Pxij that constitute a pixel array, the plurality of sub-pixels Pxij are configured to display a dynamic picture or a static image, and the display region 100 may be referred to as an active area (AA). In an exemplary implementation mode, the display substrate may be a flexible substrate, and accordingly the display substrate can be deformed, for example, can be crimped, bent, folded, or curled.

In an exemplary implementation mode, a bonding region 200 may include a fan-out zone, a bending zone, a driver chip zone, and a bonding pin zone that are disposed sequentially along a direction away from the display region 100. The fan-out zone is connected to the display region 100 and may include at least a plurality of data fan-out lines. A plurality of data fan-out lines are configured to be connected with data signal lines of the display region in a fan-out wiring manner. The bending zone is connected with the fan-out zone and may include a composite insulating layer provided with a groove, and is configured to bend the bonding region to the back of the display region. The driver chip zone may include an Integrated Circuit (IC for short) and is configured to be connected with the plurality of data fan-out lines. The bonding pin zone may at least include a plurality of bonding pads, and is configured to be bonded to and connected with an external Flexible Printed Circuit (FPC for short).

In an exemplary implementation mode, the bezel region 300 may include a circuit zone, a power supply line zone, and a crack dam zone and a cutting zone which are sequentially disposed along the direction away from the display region 100. The circuit zone is connected with the display region 100 and may at least include a gate drive circuit which is connected with a first scan line, a second scan line and a light emitting control line of a pixel driving circuit in the display region 100. The power supply line zone is connected with the circuit zone and may at least include a bezel power supply lead line that extends along a direction parallel to the edge of the display region and is connected with a cathode in the display region 100. The crack dam zone is connected with the power supply line zone and may at least include a plurality of cracks disposed on the composite insulating layer. The cutting zone is connected with the crack dam zone and may at least include a cutting groove disposed on the composite insulating layer, and the cutting groove is used for cutting respectively along the cutting groove by a cutting device after all film layers of the display substrate are prepared.

In an exemplary implementation mode, the fan-out zone in the bonding region 200 and the power supply line zone in the bezel region 300 may be provided with a first isolation dam and a second isolation dam, the first isolation dam and the second isolation dam may extend in a direction parallel to the edge of the display region 100, thus forming an annular structure surrounding the display region 100, wherein the edge of the display region is an edge at a side of the display region, the bonding region or the bezel region.

Figure 3:
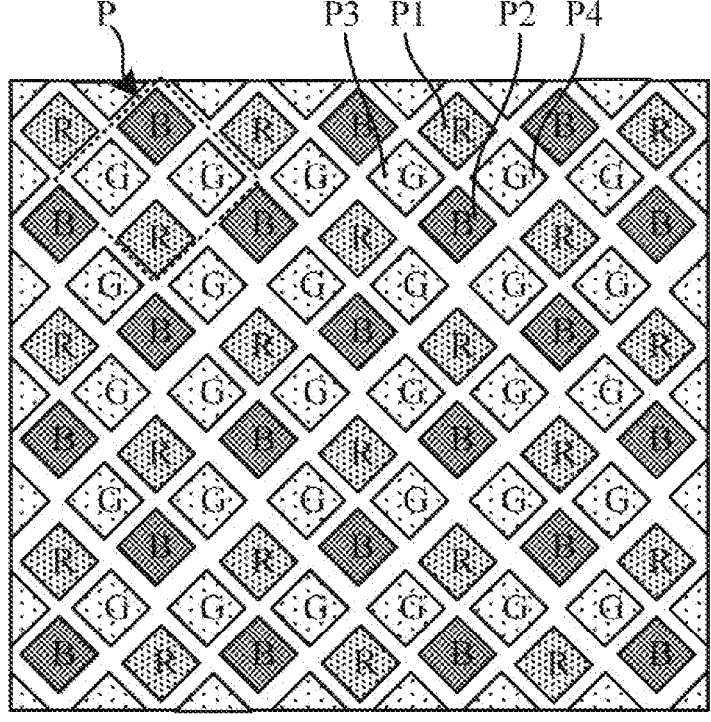
FIG. 3 is a schematic diagram of a planar structure of a display region in a display substrate.

FIG. 3 is a schematic diagram of a planar structure of a display region in a display substrate. As shown in FIG. 3, the display substrate may include a plurality of pixel units P arranged in a matrix. At least one pixel unit P may include a first sub-pixel P1 emitting light of a first color, a second sub-pixel P2 emitting light of a second color, a third sub-pixel P3 emitting light of a third color and a fourth sub-pixel P4 emitting light of a fourth color. Each circuit unit may include a circuit unit and a light emitting device, the circuit unit may include at least a pixel driving circuit connected with a scanning signal line, a light emitting signal line, and a data signal line, respectively. The pixel driving circuit is configured to receive a data voltage transmitted by the data signal line and output a corresponding current to the light emitting device under control of the scan signal line and the light emitting signal line. The light emitting device in each circuit unit is connected with a pixel driving circuit of a sub-pixel where the light emitting device is located, and is configured to emit light with a corresponding brightness in response to a current output by the pixel driving circuit of the sub-pixel where the light emitting device is located.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation mode, the shape of the sub-pixel may be rectangle, diamond, pentagonal, hexagonal. The four sub-pixels may be arranged in a manner of diamond to form an RGBG pixel arrangement. In other exemplary implementations, the four sub-pixels may be arranged side by side horizontally, side by side vertically, or square-shaped manner, which is not limited in the present disclosure.

In an exemplary implementation mode, the pixel unit may include three sub-pixels, the three sub-pixels may be arranged in manner of horizontal juxtaposition, vertical juxtaposition or triangle, which is not limited in the present disclosure.

Figure 4:
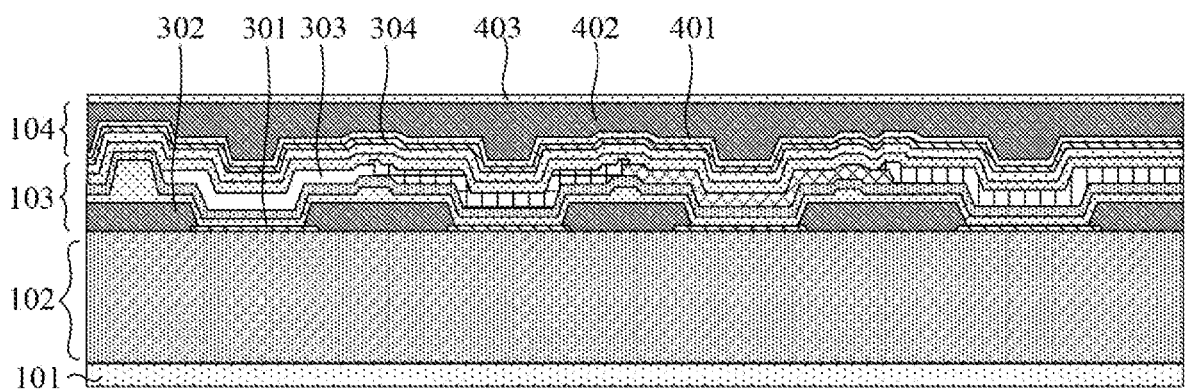
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101. In some possible implementations, the display substrate may include other film layers, such as a touch structure layer, which is not limited here in the present disclosure.

In an exemplary implementation mode, the base substrate 101 may be a flexible base substrate, or a rigid base substrate. The drive circuit layer 102 may include a plurality of circuit units, each of which may at least include a pixel driving circuit composed of a plurality of transistors and storage capacitors. The light emitting structure layer 103 may include a plurality of light emitting devices, each of which may include at least an anode 301, a pixel define layer 302, an organic emitting layer 303 and a cathode 304. The anode 301 is connected with the pixel driving circuit, the organic emitting layer 303 is connected with the anode 301, the cathode 304 is connected with the organic emitting layer 303, the organic emitting layer 303 emits light of a corresponding color under driving of the anode 301 and the cathode 304. The encapsulation layer 104 may include a first encapsulation layer 401, a second encapsulation layer 402, and a third encapsulation layer 403 that are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 to form an inorganic material/organic material/inorganic material laminated structure and ensure that external water vapor cannot enter the light emitting structure layer 103.

In an exemplary implementation mode, the organic light emitting layer may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary implementation mode, one or more layers of hole injection layers, hole transport layers, electron block layers, hole block layers, electron transport layers, and electron injection layers of all sub-pixels may be a common layer communicated together. Emitting layers of adjacent circuit units may be overlapped slightly, or may be mutually isolated.

Figure 5:
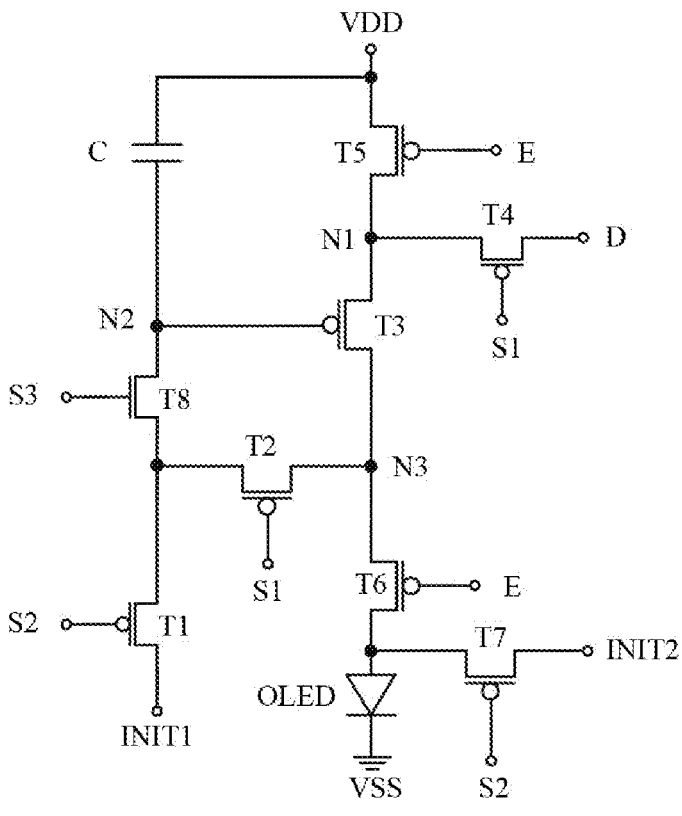
FIG. 5 is a schematic diagram of an equivalent circuit of a pixel driving circuit.

FIG. 5 is a schematic diagram of an equivalent circuit of a pixel driving circuit. In an exemplary implementation mode, the pixel driving circuit may have a structure of 3T1C, 4T1C, 5T1C, 5T2C, 6T1C, 7T1C or 8T1C. As shown in FIG. 5, the pixel driving circuit may include eight transistors (a first transistor T1 to an eighth transistor T8) and one storage capacitor C, the pixel driving circuit is connected with nine signal lines (a data signal line D, a first scan signal line S1, a second scan signal line S2, a third scan signal line S3, a light emitting signal line E, a first initial signal line INIT1, a second initial signal line INIT1, a first power supply line VDD and a second power supply line VSS), respectively.

In an exemplary implementation mode, the pixel driving circuit may include a first node N1, a second node N2, and a third node N3. Here, the first node N1 is connected with a first electrode of the third transistor T3, a second electrode of the fourth transistor T4 and a second electrode of the fifth transistor T5, respectively, the second node N2 is connected with a second electrode of the eighth transistor T8, a control electrode of the third transistor T3 and a second end of the storage capacitor C, respectively, and the third node N3 is connected with a second electrode of the second transistor T2, a second electrode of the third transistor T3 and a first electrode of the sixth transistor T6, respectively.

In an exemplary implementation mode, a first end of the storage capacitor C is connected with the first power supply line VDD, and the second end of the storage capacitor C is connected with the second node N2, i.e., the second end of the storage capacitor C is connected with the control electrode of the third transistor T3.

In an exemplary implementation mode, a control electrode of the first transistor T1 is connected with the second scan signal line S2, a first electrode of the first transistor T1 is connected with the first initial signal line INIT1, and a second electrode of the first transistor T1 is connected with a first electrode of the eighth transistor T8. A control electrode of the eighth transistor T8 is connected with the third scan signal line S3, a first electrode of the eighth transistor T8 is connected with the second electrode of the first transistor T1, and the second electrode of the eighth transistor T8 is connected with the second node N2. When a scan signal with an on-level is applied to the second scan signal line S2 and the third scan signal line S3, the first transistor T1 and the eighth transistor T8 transmit a first initialization voltage to the second end of the storage capacitor C, thereby realizing initialization of the storage capacitor C.

In an exemplary implementation mode, the control electrode of the second transistor T2 is connected with the first scan signal line S1, a first electrode of the second transistor T2 is connected with the second electrode of the first transistor T1 and the first electrode of the eighth transistor T8, and the second electrode of the second transistor T2 is connected with the third node N3. When a scan signal with an on-level is applied to the first scan signal line S1 and the third scan signal line S3, the second transistor T2 and the eighth transistor T8 connect the control electrode of the third transistor T3 to the second electrode of the third transistor T3.

In an exemplary implementation mode, the control electrode of the third transistor T3 is connected with the second node N2, that is, the control electrode of the third transistor T3 is connected with the second end of the storage capacitor C, the first electrode of the third transistor T3 is connected with the first node N1, and the second electrode of the third transistor T3 is connected with the third node N3. The third transistor T3 may be referred to as a driving transistor, and the third transistor T3 determines the magnitude of the driving current flowing between the first power supply line VDD and the light emitting device according to the potential difference between its control electrode and the first electrode.

In an exemplary implementation mode, a control electrode of the fourth transistor T4 is connected with the first scan signal line S1, a first electrode of the fourth transistor T4 is connected with the data signal line D, and a second electrode of the fourth transistor T4 is connected with the first node N1. When a scan signal with an on-level is applied to the first scan signal line S1 and the third scan signal line S3, the fourth transistor T4 inputs the data voltage of the data signal line D to the first node N1, and the fourth transistor T4 is a data writing transistor.

In an exemplary implementation mode, a control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. When a light emitting signal with an on-level is applied to the light emitting signal line E, the fifth transistor T5 and the sixth transistor T6 cause the light emitting device to emit light by forming a driving current path between the first power supply line VDD and the light emitting device.

In an exemplary implementation mode, a control electrode of the seventh transistor T7 is connected with the second scan signal line S2, a first electrode of the seventh transistor T7 is connected with the second initial signal line INIT2, and a second electrode of the seventh transistor T7 is connected with the first electrode of the light emitting device. When a scan signal with an on-level is applied to the second scan signal line S2, the seventh transistor T7 transmits an second initialization voltage to the first electrode of the light emitting device so as to initialize a charge amount accumulated in the first electrode of the light emitting device or release a charge amount accumulated in the first electrode of the light emitting device.

In an exemplary implementation mode, the light emitting device may be an OLED including a first electrode (anode), an organic light emitting layer, and a second electrode (cathode), which are stacked, or may be a QLED including a first electrode (anode), a quantum-dot light emitting layer, and a second electrode (cathode), which are stacked.

In an exemplary implementation mode, a second electrode of the light emitting device is connected with a second power supply line VSS, the signal of which is a continuously supplied low-level signal, and the signal of the first power supply line VDD is a continuously supplied high-level signal.

In an exemplary implementation mode, the first transistor T1 to the eighth transistor T8 may be P-type transistors or N-type transistors. Use of a same type of transistors in a pixel driving circuit may simplify a process flow, reduce process difficulties of a display panel, and improve a product yield. In some possible implementations, the first transistor T1 to the eighth transistor T8 may include P-type transistors and N-type transistors.

In an exemplary implementation mode, the first transistor T1 to the eighth transistor T8 may employ a low temperature poly-silicon transistor, or may employ an oxide transistor, or may employ a low temperature poly-silicon transistor and a metal oxide transistor. Low Temperature Poly-Silicon (LTPS) is used as the active layer of the low temperature poly-silicon transistor, and metal oxide semiconductor (Oxide) is used as the active layer of the metal oxide transistor. The low temperature poly-silicon transistor has advantages such as high migration rate and fast charging. The oxide transistor has advantages such as low drain current. The low temperature poly-silicon transistor and the metal oxide transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Figure 6:
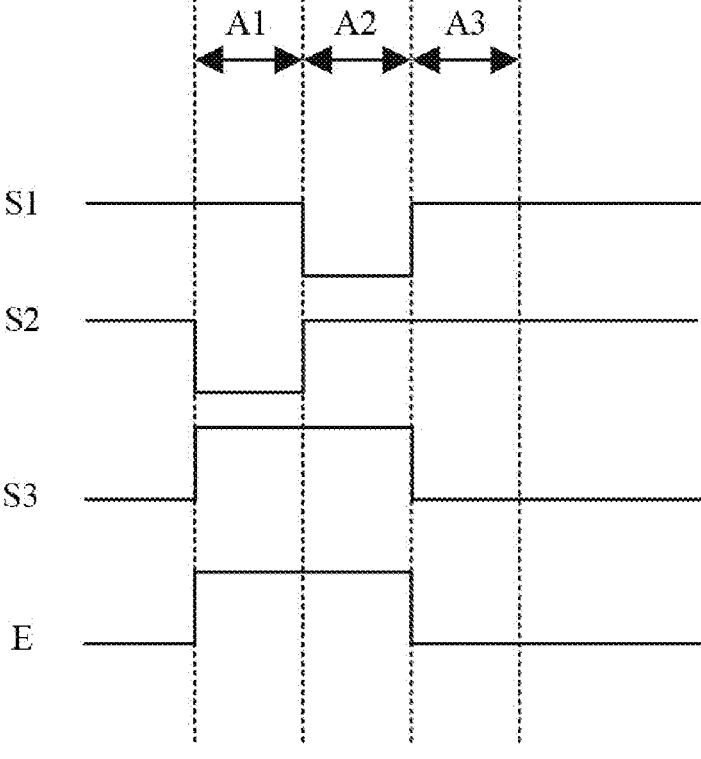
FIG. 6 is a working timing diagram of a pixel driving circuit.

FIG. 6 is a working timing diagram of a pixel driving circuit. An exemplary implementation mode of the present disclosure will be described below with reference to a working process of a pixel driving circuit exemplified in FIG. 5, in which the pixel driving circuit includes eight transistors (a first transistor T1 to an eighth transistor T8) and one storage capacitor C, the first transistor T1 to a seventh transistor T7 are all P-type transistors, and the eighth transistor T8 is an N-type transistor. In an exemplary implementation mode, the working process of the pixel driving circuit may include following stages.

In a first stage A1, referred to as a reset stage, a signal of the second scan signal line S2 is a low-level signal, and signals of the first scan signal line S1, the third scan signal line S3 and the light emitting signal line E are high-level signals. The signal of the second scan signal line S2 is a low-level signal, so that the first transistor T1 is turned on, the signal of the third scan signal line S3 is a high-level signal, so that the eighth transistor T8 is turned on, and the signal of the first initial signal line INIT1 is provided to the second node N2 through the first transistor T1 and the eighth transistor T8, to initialize (reset) the storage capacitor C and clear the original charge in the storage capacitor. The signal of the second scan signal line S2 is a low-level signal, so that the seventh transistor T7 is turned on, and the signal of the second initial signal line INIT2 is provided to a first electrode of the OLED to initialize (reset) the first electrode of the OLED, empty the pre-stored voltage inside the OLED, and complete the initialization to ensure that the OLED does not emit light. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2, the third scan signal line S3 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2 and the fourth transistor T4 are turned on, and the signal of the third scan signal line S3 is a high-level signal, so that the eighth transistor T8 is turned on. The second transistor T2, the fourth transistor T4 and the eighth transistor T8 are turned on, so that the data voltage output from the data signal line D is provided to the second node N2 through the first node N1, the turned-on third transistor T3, the third node N3, the turned-on second transistor T2, the turned-on eighth transistor T8, the difference between the data voltage out-putted from the data signal line D and the threshold voltage of the third transistor T3 is charged into the storage capacitor C. The voltage of the second end (second node N2) of the storage capacitor C is Vd−|Vth|, Vd is the data voltage outputted from the data signal line D, and Vth is the threshold voltage of the third transistor T3. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off.

In a third stage A3, referred to as a light emitting stage, the signals of the light emitting signal line E and the third scanning signal line S3 are low-level signals, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel driving circuit, a driving current flowing through the third transistor T3 (drive transistor) is determined by a voltage difference between a gate electrode and a first electrode of the third transistor T3. The voltage of the second node N2 is Vdata-|Vth|, so the driving current of the third transistor T3 is as follows.

$$I=K^*(Vgs-Vth)^2=K^*[(Vdd-Vd+|Vth|)-Vth]^2=K^* \\ [(Vdd-Vd]^2$$

Herein, I is the driving current flowing through the third transistor T3, i.e., a driving current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements for the display effect of display products. Super-narrow bezels have become a new trend in the development of display products. Therefore, bezel narrowing or even a bezel-less design has received more attention in the design of OLED display products. In a display substrate, the signal lines of an integrated circuit and a bonding pad in a bonding region need to be fanned out through a data connection line to be introduced into a wider display region, making the fan-shaped region occupy more space, resulting in a larger width of a lower bezel.

An exemplary embodiment of the present disclosure provide a display substrate, a structure in which data connection lines are located in the display region (Fanout in AA, FIAA for short) is adopted. First ends of a plurality of data connection lines are correspondingly connected with integrated circuits in the bonding region, and second ends of the plurality of data connection lines extend from the bonding region to the display region and are correspondingly connected with a plurality of data signal lines in the display region. Since the bonding region does not need to be provided with fan-shaped oblique lines, the width of the fan-out zone is reduced, and the width of the lower bezel is effectively reduced.

In an exemplary implementation mode, a display substrate according to an exemplary embodiment of the present disclosure may include a drive circuit layer disposed on a base substrate, a light emitting structure layer disposed on a side of the drive circuit layer away from the base substrate, and an encapsulation structure layer disposed on a side of the light emitting structure layer away from the base substrate. In a plane parallel to the display substrate, the display substrate may at least include a display region, a bonding region on a side of the display region, and a bezel region on the other side of the display region. In an exemplary embodiment, the drive circuit layer in the display region may include a plurality of circuit units constituting a plurality of unit rows and a plurality of unit columns, and at least one circuit unit may include a pixel driving circuit configured to output a corresponding current to a connected light emitting device. The light emitting structure layer in the display region may include a plurality of sub-pixels constituting a pixel array, at least one sub-pixel may include a light emitting device connected to a pixel driving circuit of a corresponding circuit unit, and the light emitting device is configured to emit light of a corresponding brightness in response to a current output by the connected pixel driving circuit.

In an exemplary embodiment, sub-pixels in the present disclosure refer to regions divided according to light emitting devices, and circuit units in the present disclosure refer to regions divided according to pixel driving circuits. In an exemplary embodiment, the position of the orthographic projection of the sub-pixel on the base substrate may correspond to the position of the orthographic projection of the circuit unit on the base substrate, or the position of the orthographic projection of the sub-pixel on the base substrate may not correspond to the position of the orthographic projection of the circuit unit on the base substrate.

In an exemplary embodiment, a display substrate according to an exemplary embodiment of the present disclosure may include a shielding conductive layer disposed on a base substrate and a functional structure layer disposed on a side of the shielding conductive layer away from the base substrate, the shielding conductive layer at least includes a first connection line, the functional structure layer at least includes a second connection line and a data signal line; in a plane parallel to the display substrate, the display substrate includes a plurality of circuit units forming a plurality of unit rows and a plurality of unit columns, at least one circuit unit includes a pixel driving circuit, the data signal line is connected to a plurality of pixel driving circuits of one unit column, the data signal line is configured to provide a data signal to the pixel driving circuit; the second connection line is connected with the first connection line, and the data signal line is connected with the second connection line.

In an exemplary implementation mode, the functional structure layer includes a plurality of conductive layers, the second connection line and the data signal line are disposed in different conductive layers, the second connection line is connected with the first connection line through a first lap via, and the data signal line is connected with the second connection line through a second lap via.

In an exemplary implementation mode, in a plane parallel to the display substrate, the display substrate includes a display region and a bonding region located on a side of the display region in a second direction, the bonding region at least includes a lead line; a first end of the first connection line is connected with the lead line, after a second end of the first connection line extends to the display region, the second end of the first connection line is connected with a first end of the second connection line through the first lap via, after a second end of the second connection line extends in the first direction, the second end of the second connection line is connected with the data signal line through the second lap via, and the first direction intersects the second direction.

In In an exemplary implementation mode, the pixel driving circuit includes a storage capacitor and a plurality of transistors; in a plane perpendicular to the display substrate, the functional structure layer at least includes a first conductive layer, a second conductive layer, a third conductive layer, a fourth conductive layer and a fifth conductive layer disposed on a side of the shielding conductive layer away from the base substrate, the first conductive layer at least includes a first plate of the storage capacitor and gate electrodes of the plurality of transistors, the second conductive layer at least includes a second plate of the storage capacitor, the fourth conductive layer at least includes the second connection line, and the fifth conductive layer at least includes the data signal line.

In an exemplary implementation mode, the plurality of transistors include at least one polysilicon transistor and at least one oxide transistor, the functional structure layer further includes a first semiconductor layer and a second semiconductor layer, the first semiconductor layer is disposed between the shielding conductive layer and the first conductive layer, the first semiconductor layer includes an active layer of the polysilicon transistor, and the second semiconductor layer is disposed between the second conductive layer and the third conductive layer, the second semiconductor layer includes an active layer of the oxide transistor.

Figure 7A:
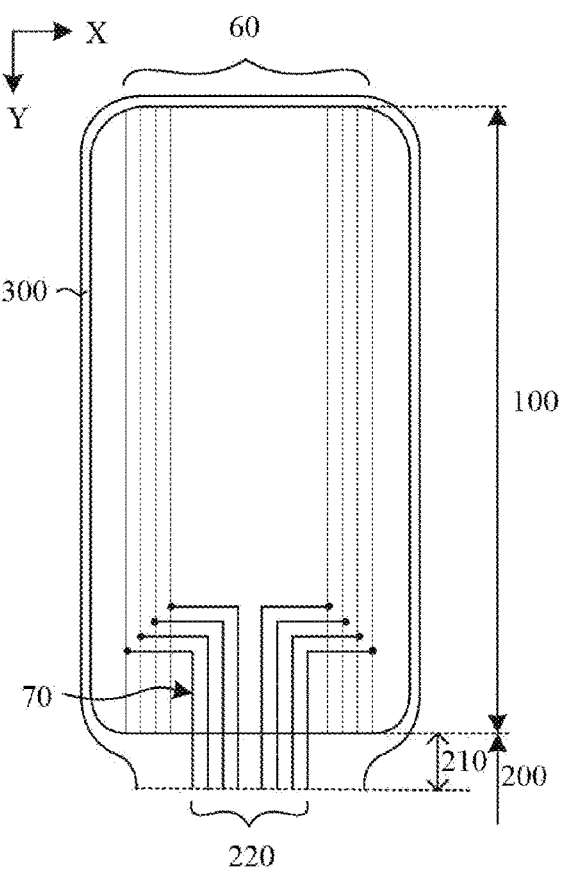
FIGS. 7a and 7b are schematic diagrams of structures of two kinds of data connection lines according to an embodiment of the present disclosure.
Figure 7B:
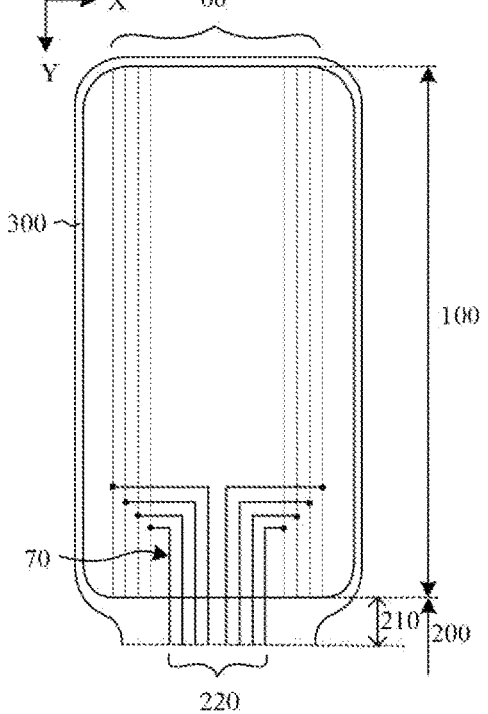

FIGS. 7a and 7b are schematic diagrams of structures of two kinds of data connection lines according to an embodiment of the present disclosure and the data connection lines adopt a FIAA structure. In a plane parallel to the display substrate, the display substrate may include a display region 100, a bonding region 200 on a side of the display region 100, and a bezel region 300 on other sides of the display region 100, the display region 100 may at least include a plurality of circuit units, a plurality of data signal lines 60, a plurality of data connection lines 70, and the bonding region 200 may at least include a lead region 210, which may include a plurality of lead lines 220.

In an exemplary implementation mode, a plurality of circuit units may form a plurality of unit rows and a plurality of unit columns, each unit row may include a plurality of circuit units sequentially disposed in a first direction X, the plurality of unit rows can be sequentially disposed in a second direction Y, and each unit column may include a plurality of circuit units sequentially disposed in the second direction Y, the plurality of unit columns may be sequentially disposed in the first direction X, and the first direction X intersects the second direction Y. In an exemplary implementation mode, the second direction Y may be an extension direction (vertical direction) of the data signal line, and the first direction X may be perpendicular to the second direction Y.

In an exemplary embodiment, the data signal lines 60 may be in a line shape extending along the second direction Y, and the plurality of data signal lines 60 are sequentially disposed at set intervals in the first direction X, each of which is connected with pixel driving circuits of a plurality of circuit units in one unit column.

In an exemplary implementation mode, the plurality of data connection lines 70 may be located in a region of the display region close to a side of the bonding region 200, first ends of the plurality of data connection lines 70 are correspondingly connected to the plurality of lead lines 220 of the lead region 210, after second ends of the plurality of data connection lines 70 extend toward the direction of the display region 10, they are correspondingly connected with the plurality of data signal lines 60, so that the plurality of data signal lines 60 in the display region 100 are correspondingly connected with the plurality of lead lines 220 in the bonding region 200 through the plurality of data connection lines 70 in the display region 100.

In an exemplary implementation mode, the quantity of data connection lines in the display region may be the same as the quantity of data signal lines, each of the data signal lines is correspondingly connected with one of the lead lines through one of the data connection lines. Alternatively, the quantity of data connection lines in the display region may be less than the quantity of data signal lines, and a part of the data signal lines in the display region are connected with the lead lines correspondingly through the data connection lines, and the other part of the data signal lines are directly connected with the lead lines, which is not limited in the present disclosure.

Figure 8:
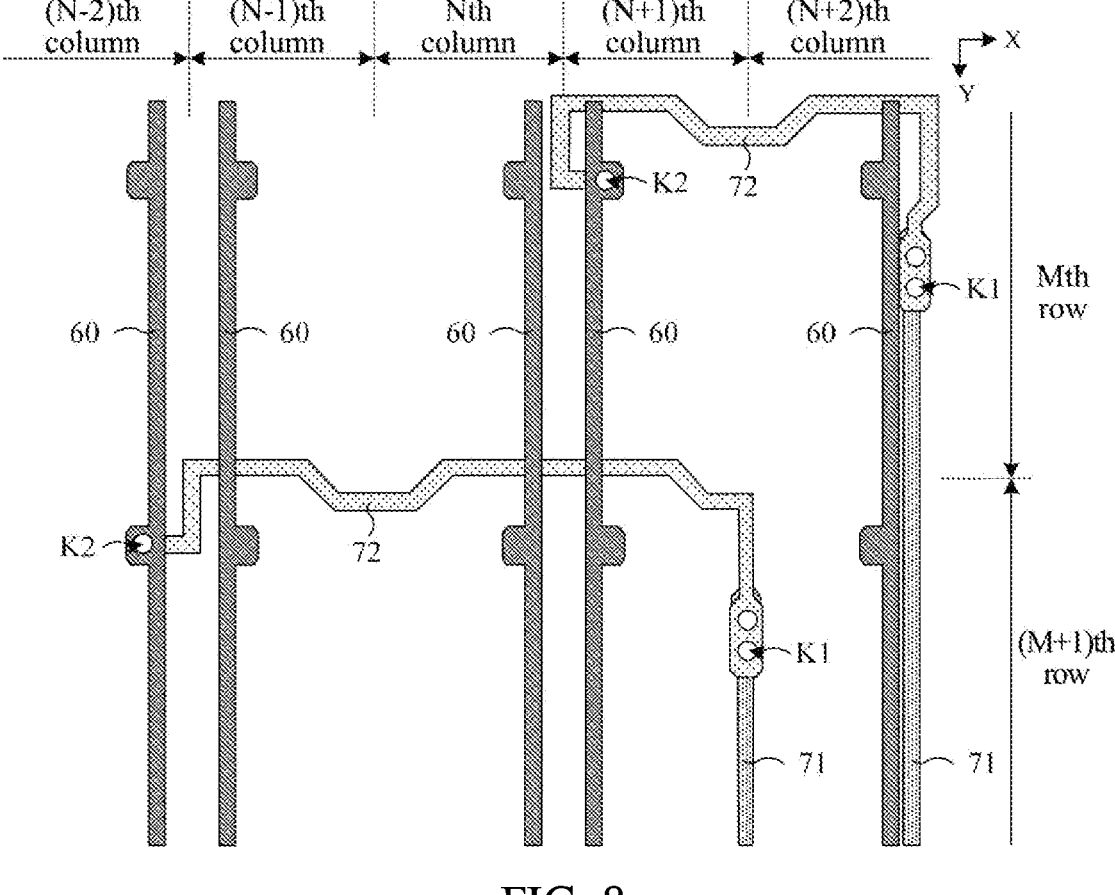
FIG. 8 is a schematic diagram of a connection between a data connection line and a data signal line according to an embodiment of the present disclosure.

FIG. 8 is a schematic diagram of a connection between a data connection line and a data signal line according to an exemplary embodiment of the present disclosure. As shown in FIG. 8, in an exemplary implementation mode, the data connection line 70 may include a first connection line 71 having a shape of a line with a main body portion extending along the second direction Y, a second connection line 72 having a shape of a line with a main body portion extending in the first direction X, and the data signal line 60 has a shape of a line extending along the second direction Y.

In the present disclosure, "A extends in a B direction" means that A may include a main portion, which is a line, a line segment or a strip-shaped body, and a secondary portion connected with the main portion, the main portion extends in the B direction, and a length of the main portion extending in the B direction is greater than a length of the secondary portion extending in another direction. In the following description, "A extends in a B direction" means "the main body portion of A extends in a B direction". In an exemplary implementation mode, the second direction Y may be a direction pointing to the bonding region from the display region, and the opposite direction of the second direction Y may be a direction pointing to the display region from the bonding region.

In an exemplary implementation mode, the display substrate may include a shielding conductive layer disposed on a base substrate and a functional structure layer disposed on a side of the shielding conductive layer away from the base substrate, the first connection line 71 may be disposed in the shielding conductive layer, and the data signal line 60 and the second connection line 72 may be disposed in the functional structure layer.

In an exemplary implementation mode, the functional structure layer may include a plurality of conductive layers, and the second connection line 72 and the data signal line 60 may be provided in different conductive layers, the second connection line is connected to the first connection line 71 through a first lap via K1, and the data signal line 60 can be connected to the second connection line 72 through a second lap via K2.

In an exemplary implementation mode, the first connection line 71 may be disposed between adjacent unit columns.

In an exemplary implementation mode, a first end of the first connection line 71 is connected with the lead line 220 of the lead region 210, after the second end of the first connection line 71 extends in the opposite direction of the second direction Y toward the display region 100, it is connected with the first end of the second connection line 72 through a first lap via K1. After a second end of the second connection line 72 extends in the first direction X or the opposite direction of the first direction X, it is connected with the data signal line 60 through a second lap via K2.

In an exemplary implementation mode, an end of the first connection line 71 close to the second connection line 72 (an end away from the bonding region) may be connected with a first connection block, the first connection block may have a strip shape extending along the second direction Y, the orthographic projection of the first connection block on the base substrate at least partially overlaps the orthographic projection of the second connection line 72 on the base substrate, the second connection line 72 is connected with the first connection block through the first lap via K1.

In an exemplary implementation mode, an end of the second connection line 72 close to the first connection line 71 is connected with a second connection block, the second connection block may have a strip shape, extending along the second direction Y, the orthographic projection of the second connection block on the base substrate at least partially overlaps the orthographic projection of the first connection line 71 on the base substrate, and the second connection block is connected with the first connection line 71 through the first lap via K1.

In an exemplary implementation mode, the orthographic projection of the first connection block on the base substrate at least partially overlaps the orthographic projection of the second connection block on the base substrate, and the second connection block is connected to the first connection block through the first lap via K1.

In an exemplary implementation mode, the second connection line 72 may include at least a first sub-line, a second sub-line, a third sub-line, and a fourth sub-line, a first end of the first sub-line is connected with a second end of the first connection line 71, after a second end of the first sub-line extends in the opposite direction of the second direction Y, it is connected with the first end of the second sub-line, after a second end of the second sub-line extends in the first direction X or the opposite direction of the first direction X, it is connected with a first end of the third sub-line, after a second end of the third sub-line extends along the second direction Y, it is connected with a first end of the fourth sub-line, after a second end of the fourth sub-line extends along the first direction X or the opposite direction to the first direction X, it is connected with the data signal line 60.

In an exemplary implementation mode, the first sub-line may be disposed between adjacent unit columns.

In an exemplary implementation mode, the second sub-line may have a shape of a bending line extending in the first direction X or the opposite direction of the first direction X, and may include at least one protruding segment protruding toward the direction of the bonding region.

In an exemplary implementation mode, the third sub-line may be disposed between adjacent unit columns.

In an exemplary implementation mode, the functional structure layer may at least include a first conductive layer, a second conductive layer, a third conductive layer, a fourth conductive layer, and a fifth conductive layer disposed on a side of the shielding conductive layer away from the base substrate, the first conductive layer may at least include a first plate of a storage capacitor and gate electrodes of a plurality of transistors, the second conductive layer may at least include a second plate of the storage capacitor, the fourth conductive layer may at least include a second connection line 72, and the fifth conductive layer may at least include a data signal line 60.

In an exemplary implementation mode, the plurality of transistors of the pixel driving circuit may include at least one polysilicon transistor and at least one oxide transistor, the functional structure layer may also include a first semiconductor layer and a second semiconductor layer, the first semiconductor layer may be disposed between the shielding conductive layer and the first conductive layer, the first semiconductor layer may include an active layer of the polysilicon transistor, the second semiconductor layer may be disposed between the second conductive layer and the third conductive layer, and the second semiconductor layer may include an active layer of the oxide transistor.

In an exemplary implementation mode, the functional structure layer may also include a plurality of insulating layers, the plurality of insulating layers may be respectively disposed between the first conductive layer and the first semiconductor layer, between the first semiconductor layer and the second conductive layer, between the second conductive layer and the second semiconductor layer, between the second semiconductor layer and the third conductive layer, between the third conductive layer and the fourth conductive layer, and between the fourth conductive layer and the fifth conductive layer.

In an exemplary implementation mode, the data connection line and the data signal line may be connected in a manner shown in FIG. 7a or may be connected in a manner shown in FIG. 7b, which is not limited in the present disclosure.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary implementation of the present disclosure, "the orthographic projection of B is within a range of the orthographic projection of A" or "the orthographic projection of A includes the orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation mode, taking 10 circuit units (2 unit rows and 5 unit columns) as an example, the preparation process of the display substrate may include the following operations.

(1) Forming a pattern of a shielding conductive layer. In an exemplary implementation mode, forming a pattern of a shielding conductive layer may include: depositing a shielding thin film on a base substrate, patterning the shielding thin film by a patterning process to form the pattern of the shielding conductive layer on the base substrate, as shown in FIGS. 9a and 9b, FIG. 9a illustrates the structure of the shielding conductive layer where a region of the first connection line is provided, and FIG. 9b illustrates the structure of the shielding conductive layer where a region of the first connection line is not provided.

Figure 9A:
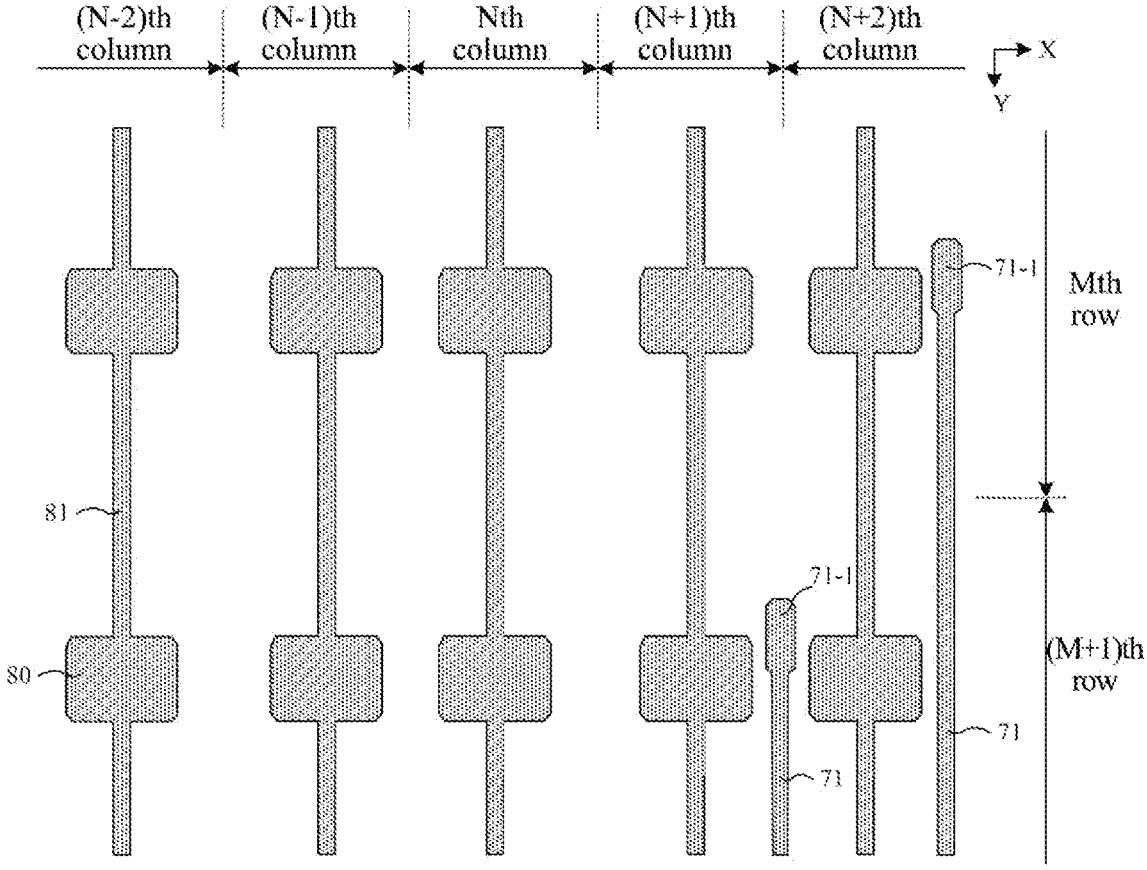
FIGS. 9a and 9b are schematic diagrams obtained after a pattern of a shielding conductive layer is formed according to an embodiment of the present disclosure.
Figure 9B:
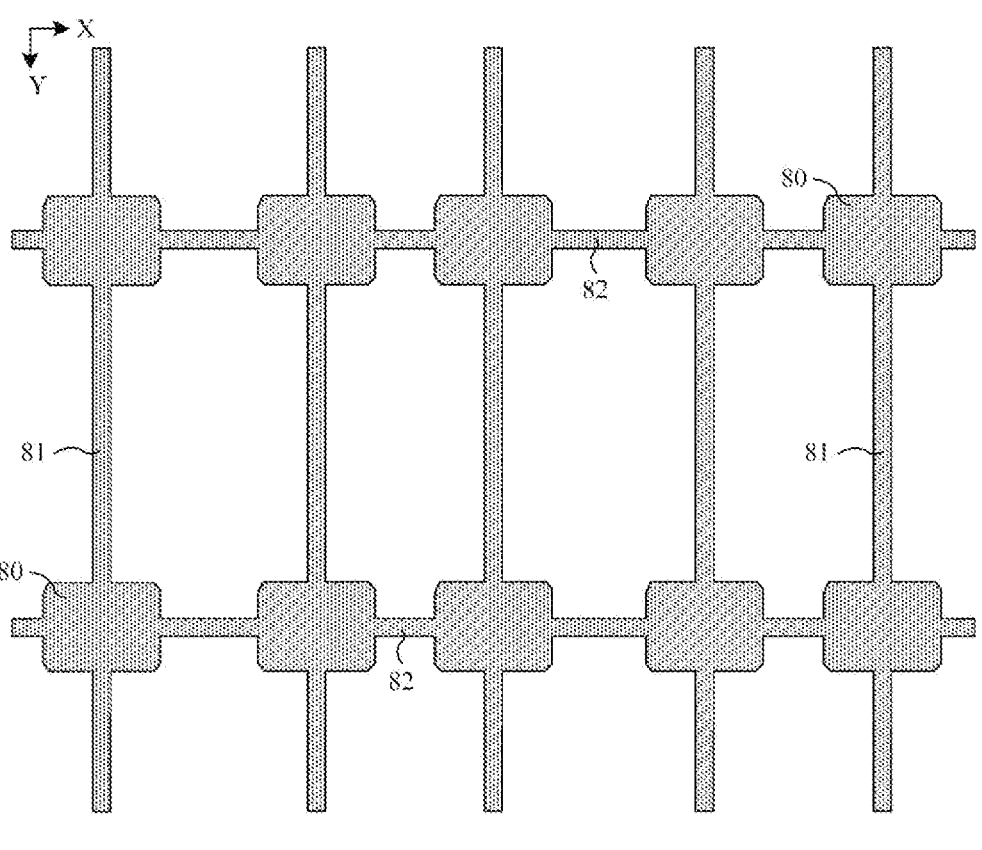

As shown in FIG. 9a, the pattern of the shielding conductive layer may at least include a first connection line 71, a shielding electrode 80 and a first shielding connection line 81 in the region where the first connection line is provided.

In an exemplary implementation mode, the shielding electrode 80 may be in a rectangular shape and may be provided in each circuit unit, and the shielding electrode 80 is configured to shade the driving transistor of the pixel driving circuit to reduce the influence of light on the electrical characteristics of the driving transistor. In addition, the shielding electrode 80 may further be configured to suppress the accumulation of electrons generated by collisional ionization inside the channel and to attenuate the accumulation of Joule heat of the channel, etc.

In an exemplary implementation mode, the first shielding connection line 81 may have a shape of a straight line extending along the second direction Y, and is configured to be connected to a plurality of shielding electrodes 80 in one unit column. The present disclosure can not only leave a larger routing space for the first connection line, but also reduce the influence on the flatness of the first semiconductor layer and improve the electrical performance of the transistor by setting the first shielding connection line to connect the shielding electrodes longitudinally.

In an exemplary implementation mode, the first connection line 71 may have a shape of a strip extending along the second direction Y, the first end of the first connection line 71 is connected with the lead line in the bonding region, and the second end of the first connection line 71 is connected with a second connection line formed subsequently after extending from the bonding region to the display region.

In an exemplary implementation mode, a second end (an end away from the bonding region) of the first connection line 71 is provided with a first connection block 71-1, which may have a strip shape extending along the second direction Y and is connected with the first connection line 71, and which is configured to be connected to the second connection line through a first lap via formed subsequently.

In an exemplary implementation mode, the first connection line 71 may be disposed between adjacent unit columns, i.e., the first connection line 71 may be disposed between adjacent circuit units in the first direction X. For example, one first connection line 71 may be provided between the circuit units of the (N+1)th column and the circuit units of the (N+1)th column. As another example, another first connection line 71 may be provided between the circuit units of the (N+2)th column and the circuit units of the (N+3)th column.

As shown in FIG. 9b, the pattern of the shielding conductive layer may at least include a first connection line 71, a shielding electrode 80, a first shielding connection line 81 and a second shielding connection line 82 in a region where the first connection line is not provided.

In an exemplary implementation mode, the shielding electrode 80 and the first shielding connection line 81 in a region where the first connection line is not provided may be substantially the same as the shielding electrode 80 and the first shielding connection line 81 in a region where the first connection line is provided.

In an exemplary implementation mode, the second shielding connection line 82 may have a shape of a straight line extending along the first direction X and is configured to be connected to a plurality of shielding electrodes 80 in one unit row.

The present disclosure can form a shielding layer network with a net-like connecting structure, which is beneficial for improving the electrical performance of the transistor, by setting the first shielding connection line to connect the shielding electrodes longitudinally and the second shielding connection line to connect the shielding electrodes transversely.

In an exemplary implementation mode, the shielding conductive layer may be made of a metal material, such as any one or more of silver (Ag), copper (Cu), aluminum (Al), titanium (Ti), and molybdenum (Mo), or an alloy material of the aforementioned above metals, and may be of a single layer structure or a multi-layer composite structure.

In an exemplary implementation mode, the shielding conductive layer may employ a Ti—Al—Ti multilayer composite structure, the thickness of a first titanium layer (bottom layer) may be about 40 nm to 60 nm, the thickness of an aluminum layer may be about 250 nm to 550 nm, and the thickness of a second titanium layer (upper layer) may be about 20 nm to 40 nm. For example, the thickness of the first titanium layer (bottom layer) may be about 50 nm, the thickness of the aluminum layer may be about 450 nm, and the thickness of the second titanium layer (upper layer) may be about 30 nm.

Figure 10:
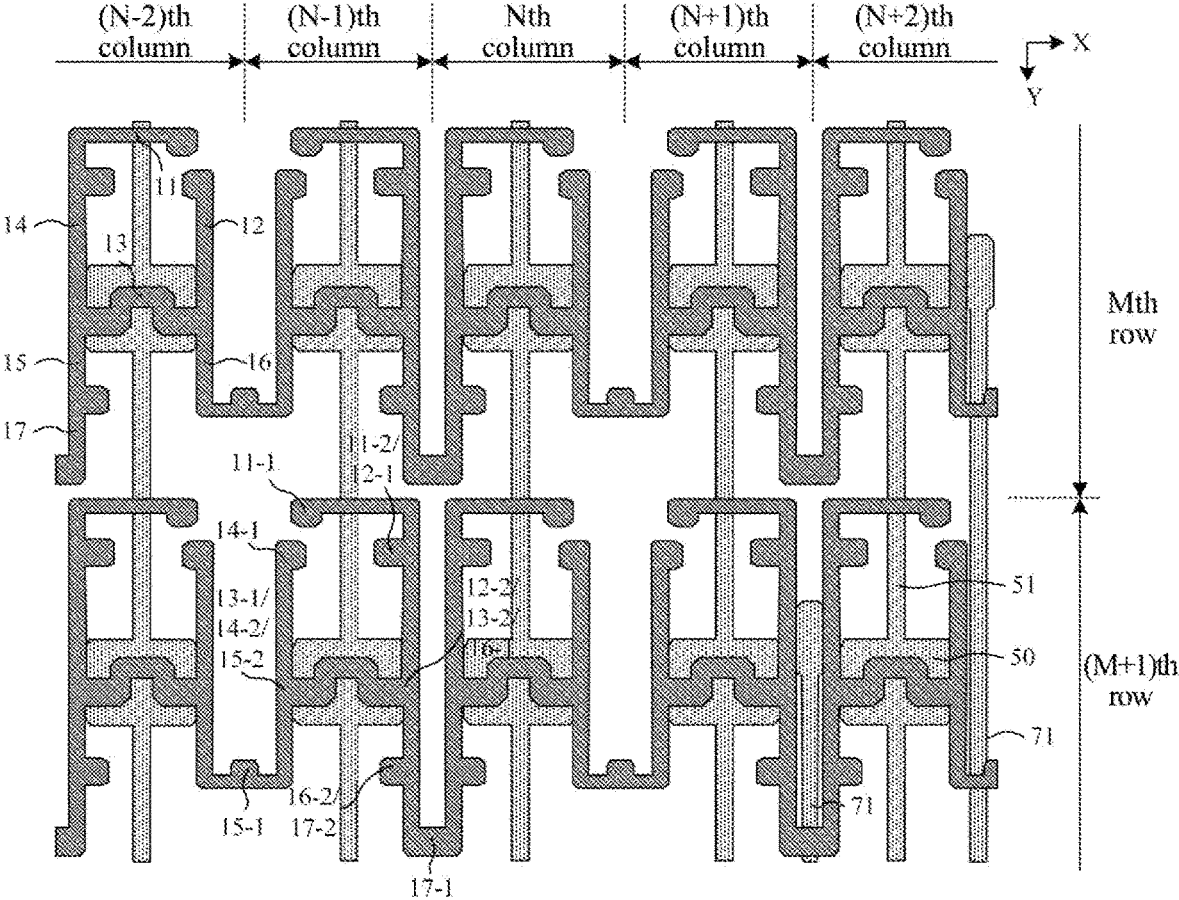
FIG. 10 is a schematic diagram obtained after a pattern of a first semiconductor layer is formed according to an embodiment of the present disclosure.

(2) Forming a pattern of a first semiconductor layer. In an exemplary implementation mode, forming a pattern of a first semiconductor layer may include sequentially depositing a first insulating thin film and a first semiconductor thin film on a base substrate, patterning the first semiconductor thin film by a patterning process, to form a first insulating layer covering the base substrate and the pattern of the first semiconductor layer disposed on the first insulating layer, as shown in FIG. 10.

In an exemplary implementation mode, the pattern of the first semiconductor layer may include a first active layer 11 of a first transistor T1 to a seventh active layer 17 of a seventh transistor T7 disposed in each circuit unit, and the first active layer 11 to the seventh active layer 17 in the circuit unit are interconnected to be of an integral structure.

In an exemplary implementation mode, in the first direction X, the second active layer 12 and the sixth active layer 16 may be located on a same side of the third active layer 13 in the present circuit unit, the fourth active layer 14, the fifth active layer 15 and the seventh active layer 17 may be located on a same side of the third active layer 13 in the present circuit unit, and the second active layer 12 and the fourth active layer 14 may be located on different sides of the third active layer 13 in the present circuit unit. In the second direction Y, the first active layer 11, the second active layer 12, and the fourth active layer 14 in the circuit units of the Mth row may be located on a side of the third active layer 13 in the present circuit unit away from the circuit units of the (M+1)th row, and the fifth active layer 15, the sixth active layer 16, and the seventh active layer 17 in the circuit units of the Mth row may be located on a side of the third active layer 13 in the present circuit unit close to the circuit units of the (M+1)th row.

In an exemplary implementation mode, the third active layer 13 may have a shape of an "omega", and the shape of the first active layer 11, the second active layer 12, the fourth active layer 14 to the seventh active layer 17 may have a shape of an "I".

In an exemplary implementation mode, the orthographic projection of the third active layer 13 on the base substrate may be within the range of the orthographic projection of the shielding electrode 80 on the base substrate.

In an exemplary implementation mode, an active layer of each transistor may include a first zone, a second zone, and a channel region located between the first zone and the second zone. In an exemplary implementation mode, the second zone 11-2 of the first active layer 11 may serve as the first zone 12-1 of the second active layer 12, the first zone 13-1 of the third active layer 13 may simultaneously serve as the second zone 14-2 of the fourth active layer 14 and the second zone 15-2 of the fifth active layer 15, the second zone 13-2 of the third active layer 13 may simultaneously serve as the second zone 12-2 of the second active layer 12 and the first zone 16-1 of the sixth active layer 16, the second zone 16-2 of the sixth active layer 16 may simultaneously serve as the second zone 17-2 of the seventh active layer 17, and the first zone 11-1 of the first active layer 11, the first zone 14-1 of the fourth active layer 14, the first zone 15-1 of the fifth active layer 15 and the first zone 17-1 of the seventh active layer 17 may be individually provided.

In an exemplary implementation mode, the first zones 15-1 of the fifth active layers 15 of two adjacent circuit units in one unit row may be connected with each other. For example, the first zones 15-1 of the fifth active layers 15 of the (N−2)th column and the first zones 15-1 of the fifth active layers 15 of the (N−1)th column are connected with each other, and the first zones 15-1 of the fifth active layers 15 of the Nth column and the first zones 15-1 of the fifth active layers 15 of the (N+1)th column are connected with each other. Since the first zone of the fifth active layer in each circuit unit is configured to be connected to a first power supply line formed subsequently, by setting the first zones of the fifth active layers of adjacent circuit units to be interconnected to be of an integral structure, the first electrodes of the fifth transistors T5 of adjacent circuit units can be guaranteed to have a same potential, which is beneficial for improving the uniformity of the panel, avoiding poor display of the display substrate and ensuring the display effect of the display substrate.

In an exemplary implementation mode, the first zones 17-1 of the seventh active layers 17 in two adjacent circuit units in one unit row can be connected with each other. For example, the first zone 17-1 of the seventh active layer 17 of the (N−1)th column and the first zone 17-1 of the seventh active layer 17 of the Nth column are connected with each other, and the first zone 17-1 of the seventh active layer 17 of the (N+1)th column and the first zone 17-1 of the seventh active layer 17 of the (N+2)th column are connected with each other. Since the first zone of the seventh active layer in each circuit unit is configured to be connected to a second initial signal line formed subsequently, by forming an integral structure in which the first zones of the seventh active layers of the adjacent circuit units are connected with each other, the first zones of the seventh active layers of the adjacent circuit units can be guaranteed to have a same potential, which is beneficial for improving the uniformity of the panel, avoiding poor display of the display substrate and ensuring the display effect of the display substrate.

In an exemplary implementation mode, the first semiconductor layer may be made of polysilicon (p-Si), i.e., the first to seventh transistors are LTPS thin film transistors. In an exemplary implementation mode, the patterning the first semiconductor thin film through the patterning process may include: forming an amorphous silicon (a-si) thin film on the first insulating thin film, dehydrogenating the amorphous silicon thin film, and crystallizing the dehydrogenated amorphous silicon thin film to form a poly silicon thin film. Subsequently, the poly silicon thin film is patterned to form the pattern of the first semiconductor layer.

Figures 11A, 11B:
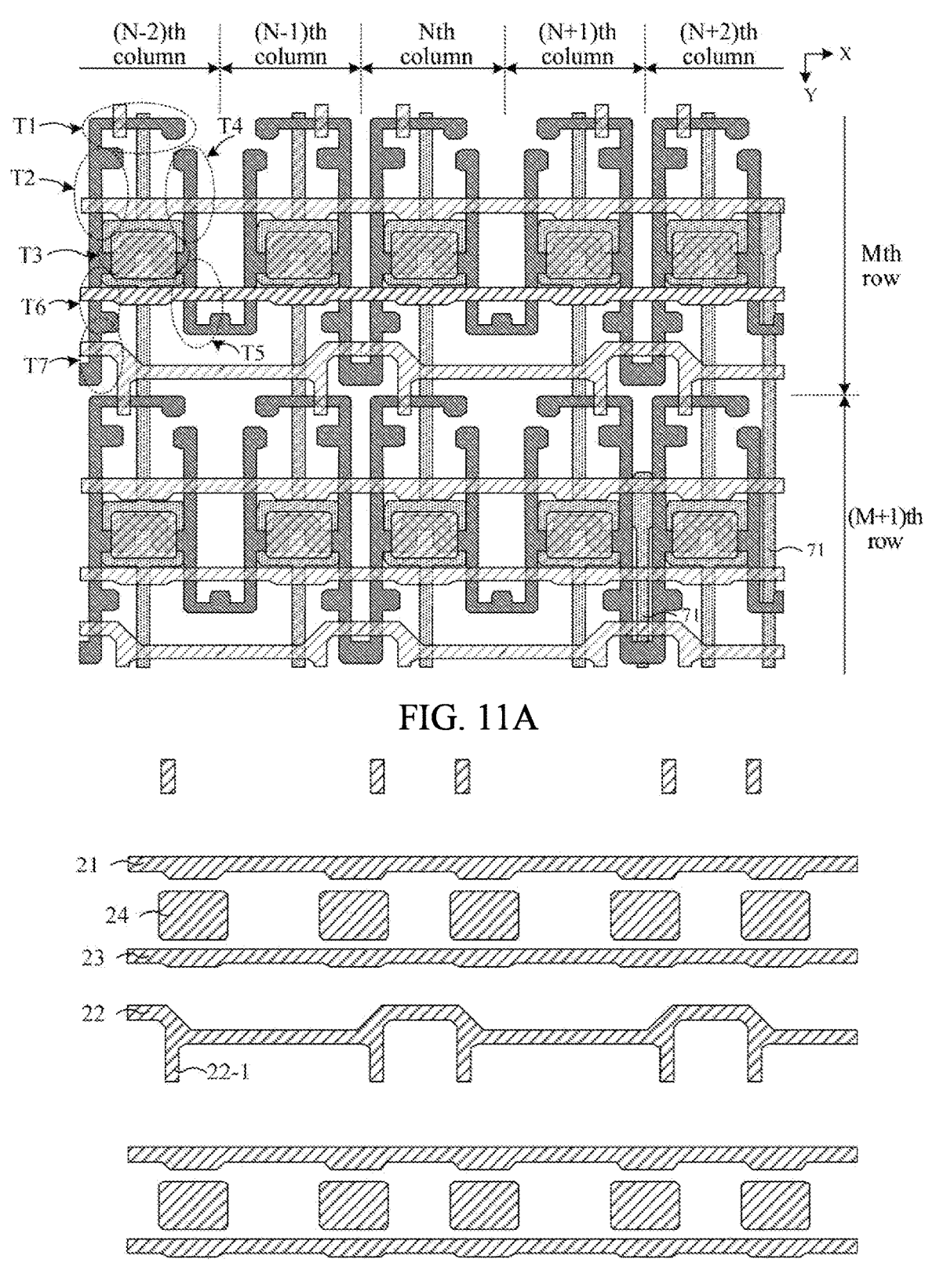
FIG. 11a and FIG. 11b are schematic diagrams obtained after a pattern of a first conductive layer is formed according to an embodiment of the present disclosure.

(3) Forming a pattern of a first conductive layer. In an exemplary implementation mode, forming a pattern of a first conductive layer may include: sequentially depositing a second insulating thin film and a first conductive thin film on the base substrate on which the above-mentioned pattern is formed, and patterning the first conductive thin film through a patterning process to form a second insulating layer that covers a pattern of the first semiconductor layer and form a pattern of the first conductive layer disposed on the second insulating layer, as shown in FIG. 11a and FIG. 11b, and FIG. 11b is a planar schematic diagram of the first conductive layer in FIG. 11a. In an exemplary implementation mode, the first conductive layer may be referred to as a first gate metal (GATE1) layer.

In an exemplary implementation mode, the pattern of the first conductive layer of each circuit unit may at least include the first scan signal line 21, the second scan signal line 22, the light emitting control line 23, the first plate 24 of the storage capacitor.

In an exemplary implementation mode, the first plate 24 may be in a shape of a rectangle, and chamfers may be provided at corners of the rectangle. The orthographic projection of the first plate 24 on the base substrate is at least partially overlapped with the orthographic projection of the third active layer of the third transistor T3 on the base substrate. In an exemplary implementation mode, the first plate 24 may serve as a plate of the storage capacitor and a gate electrode of the third transistor T3 simultaneously.

In an exemplary implementation mode, the first scan signal line 21 may have a shape of a line with a main body portion extending in the first direction X, the first scan signal lines 21 in the circuit units of the Mth row may be located on a side of the first plate 24 of the present circuit unit away from the circuit units of the (M+1)th row, a region where the first scan signal line 21 overlaps the second active layer of the present circuit unit serves as a gate electrode of the second transistor T2, and a region where the first scan signal line 21 overlaps the fourth active layer of the present circuit unit serves as a gate electrode of the fourth transistor T4.

In an exemplary implementation mode, the second scan signal line 22 may have a shape of a bending line with a main body portion extending in the first direction X, the second scan signal lines 22 in the circuit units of the Mth row may be located on a side of the first plate 24 of the present circuit unit close to the circuit units of the (M+1)th row, the second scan signal line 22 is connected with a gate block 22-1 extending in a direction away from the first plate 24, a region where the second scan signal line 22 overlaps the seventh active layer of the present circuit unit serves as a gate electrode of the seventh transistor T7, and a region where the gate block 22-1 overlaps the first active layers of the circuit units of the next row serves as a gate electrode of the first transistor T1.

In an exemplary implementation mode, the second scan signal lines 22 in the circuit units of the Mth row simultaneously drives the seventh transistors T7 in the circuit units of the Mth row and the first transistors T1 in the circuit units of the (M+1)th row.

In an exemplary implementation mode, the light emitting control line 23 may have a shape of a line with a main body portion extending in the first direction X, the light emitting control line 23 may be located between the first plate 24 and the second scan signal line 22, a region where the light emitting control line 23 overlaps the fifth active layer of the present circuit unit serves as a gate electrode of the fifth transistor T5, and a region where the light emitting control line 23 overlaps the sixth active layer of the present circuit unit serves as a gate electrode of the sixth transistor T6.

In an exemplary implementation mode, after the pattern of the first conductorization layer is formed, the first semiconductor layer may be subjected to a conductorization treatment by using the first conductorization layer as a shield. A region of the first semiconductor layer, which is shielded by the first conductorization layer, forms channel regions of the first transistor T1 to the seventh transistor T7, and a region of the first semiconductor layer, which is not shielded by the first conductorization layer, is made to be conductorized, that is, first zones and second zones of the first transistor T1 to the seventh active layer are all made to be conductorized.

Figures 12A, 12B:
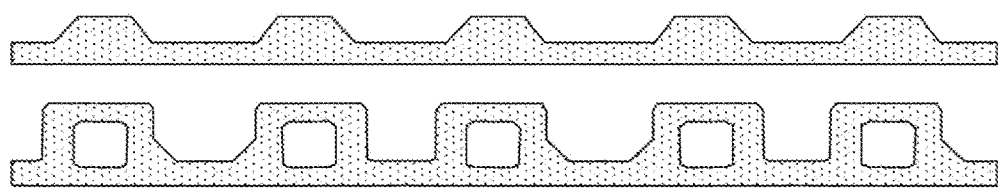
FIG. 12a and FIG. 12b are schematic diagrams obtained after a pattern of a second conductive layer is formed according to an embodiment of the present disclosure.

(4) Forming a pattern of a second conductive layer. In an exemplary implementation mode, forming a pattern of a second conductive layer may include: on the base substrate on which the aforementioned patterns is formed, depositing a third insulating thin film and a second conductive thin film sequentially, and patterning the second conductive thin film by a patterning process to form a third insulating layer covering the first conductive layer and a pattern of the second conductive layer disposed on the third insulating layer, as shown in FIGS. 12*a* and 12*b*, and FIG. 12*b* is a schematic plan view of the second conductive layer in FIG. 12*a*. In an exemplary implementation mode, the second conductive layer may be referred to as a second gate metal (GATE2) layer.

In an exemplary implementation mode, the pattern of the second conductive layer of each circuit unit at least includes a third shielding connection line 31, a second plate 32 of the storage capacitor, and a plate connection line 33.

In an exemplary implementation mode, the profile of the second plate 32 may be of a rectangular shape, the corners of the rectangular shape may be chamfered, the orthographic projection of the second plate 32 on the base substrate at least partially overlaps the orthographic projection of the first plate 24 on the base substrate, the second plate 32 may serve as another plate of the storage capacitor, and the first plate 24 and the second plate 32 constitute the storage capacitor of the pixel driving circuit.

In an exemplary implementation mode, the plate connection line 33 may be provided on a side of the second plate 32 in the first direction X or on a side of the second plate 32 in the opposite direction of the first direction X, so that the second plates 32 in two adjacent circuit units in one unit row are connected with each other. For example, the second plate 32 of the (N−1)th column and the second plate 32 of the N-th column may be connected with each other by the plate connection line 33. As another example, the second plate 32 of the N-th row and the second plate 32 of the (N+1)th row are connected with each other by the plate connection line 33. Since the second plate 32 in each circuit unit is connected with a first power supply line formed subsequently, by forming an integral structure in which the second plates 32 of adjacent circuit units are connected with each other, the second plate 32 of the integral structure can be multiplexed as a power supply signal line, so that a plurality of second plates 32 in a unit row can be guaranteed to have a same potential, which is beneficial for improving the uniformity of the panel, avoiding poor display of the display substrate and ensuring the display effect of the display substrate.

In an exemplary implementation mode, the second plate 32 is provided with an opening 34 which may have a rectangular shape and may be located in the middle of the second plate 32, so that the second plate 32 forms an annular structure. The opening 34 exposes the third insulating layer covering the first plate 24, and the orthographic projection of the first plate 24 on the base substrate contains the orthographic projection of the opening 34 on the base substrate. In an exemplary implementation mode, the opening 34 is configured to accommodate a first via formed subsequently, which is located in the opening 34 and exposes the first plate 24, so that a second electrode of the first transistor T1 formed subsequently is connected with the first plate 24.

In an exemplary implementation mode, the third shielding connection line 31 may have a shape of a line with a main body portion extending in the first direction X, and the third shielding connection lines 31 in the M-th row circuit unit may be located on a side of the second plate 32 of the present circuit unit away from the circuit units of the (M+1)th row.

In an exemplary implementation mode, the third shielding connection line 31 in the circuit units of the Mth row may be located on a side of the first scan signal line 21 of the present circuit unit away from the second plate 32. The third shielding connection line 31 may be a straight line of non-equal width, the width at the position where the third shielding connection line 31 overlaps an eighth active layer formed subsequently may be greater than the width at the other positions, the third shielding connection line 31 at a wider position can be used as a lower gate electrode of the eighth transistor and also as a shielding layer of the eighth transistor, to shade the channel region of the eighth transistor and ensure the electrical performance of the oxide eighth transistor.

Figures 13A, 13B:
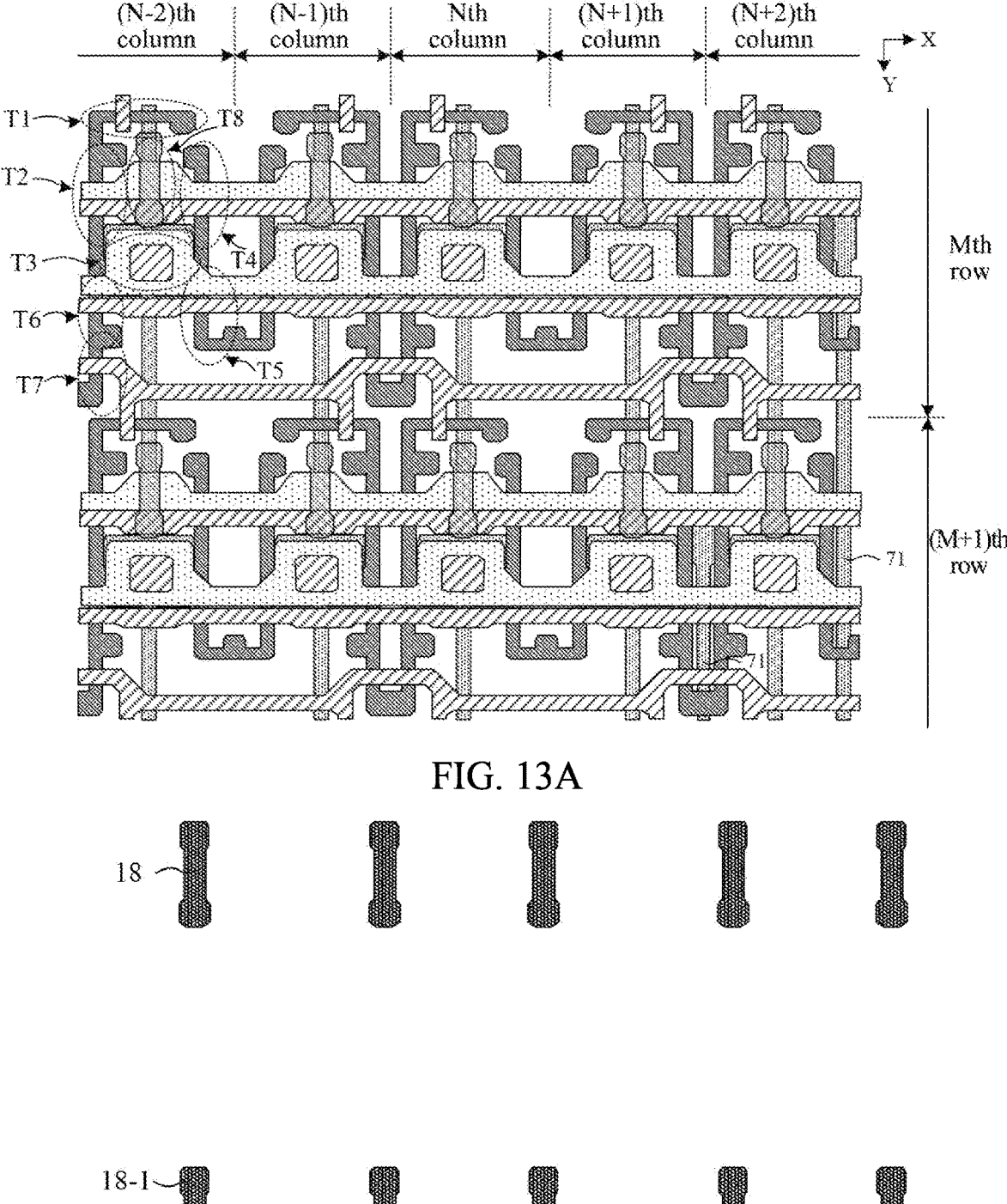
FIG. 13a and FIG. 13b are schematic diagrams obtained after a pattern of a second semiconductor layer is formed according to an embodiment of the present disclosure.

(5) Forming a pattern of a second semiconductor layer. In an exemplary implementation mode, forming the pattern of the second semiconductor layer may include: on the base substrate on which the aforementioned patterns are formed, depositing a fourth insulating thin film and a second semiconductor thin film sequentially, and patterning the second semiconductor thin film by a patterning process to form a fourth insulating layer covering the base substrate and the pattern of the second semiconductor layer disposed on the fourth insulating layer, as shown in FIGS. 13a and 13b, FIG. 13b is a schematic plan view of the second semiconductor layer in FIG. 13a.

In an exemplary implementation mode, the pattern of the second semiconductor layer of each circuit unit at least includes an eighth active layer 18 of the eighth transistor T8.

In an exemplary implementation mode, the eighth active layer 18 may have a shape of an "I", and the orthographic projection of the eighth active layer 18 on the base substrate at least partially overlaps the orthographic projection of the third shielding connection line 31 on the base substrate.

In an exemplary implementation mode, a first zone 18-1 of the eighth active layer 18 may be located on a side of the third shielding connection line 31 away from the second plate 32, and a second zone 12-2 of the eighth active layer 18 may be located on a side of the third shielding connection line 31 close to the second plate 32.

In an exemplary implementation mode, the second semiconductor layer may be made of an oxide, i.e., the eighth transistor T8 is an oxide transistor. In an exemplary implementation mode, the second semiconductor thin film may be made of Indium Gallium Zinc Oxide (IGZO), which has higher electron mobility than amorphous silicon.

Figures 14A, 14B:
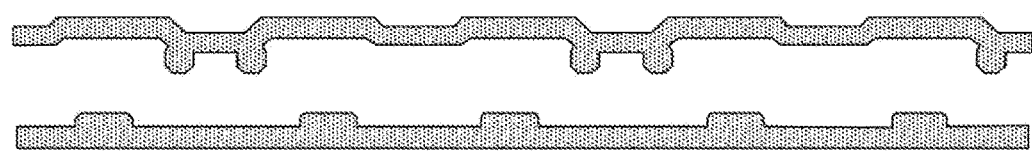
FIG. 14a and FIG. 14b are schematic diagrams obtained after a pattern of a third conductive layer is formed according to an embodiment of the present disclosure.

(6) Forming a pattern of a third conductive layer. In an exemplary implementation mode, forming the pattern of the third conductive layer may include: on the base substrate on which the aforementioned patterns are formed, depositing a fifth insulating thin film and a third conductive thin film sequentially, and patterning the third conductive thin film by a patterning process to form a fifth insulating layer covering the second semiconductor layer and the pattern of the third conductive layer disposed on the fifth insulating layer, as shown in FIGS. 14a and 14b, FIG. 14b is a schematic plan view of the third conductive layer in FIG. 14a. In an exemplary embodiment, a third conductive layer may be referred to as a third gate metal (GATE3) layer.

In an exemplary implementation mode, the pattern of the third conductive layer of each circuit unit at least includes a third scan signal line 41 and a first initial signal line 42.

In an exemplary implementation mode, the third scan signal line 41 may have a shape of a line with a main body portion extending in the first direction X, the third scan signal lines 41 in the circuit units of the Mth row may be located on a side of the first scan signal line 21 of the present circuit unit away from the circuit units of the (M+1)th row, and a region where the third scan signal line 41 of each circuit unit overlaps the eighth active layer serves as an upper gate electrode of the eighth transistor T8.

In an exemplary implementation mode, the first initial signal line 42 may have a shape of a line with a main body portion extending in the first direction X, the first initial signal lines 42 in the circuit units of the Mth row may be located on a side of the third scan signal line 41 of the present circuit unit away from the circuit units of the (M+1)th row, and the first initial signal line 42 is configured to be connected to the first zone of the first active layer through the first electrode of the first transistor T1 formed subsequently.

Figure 15:
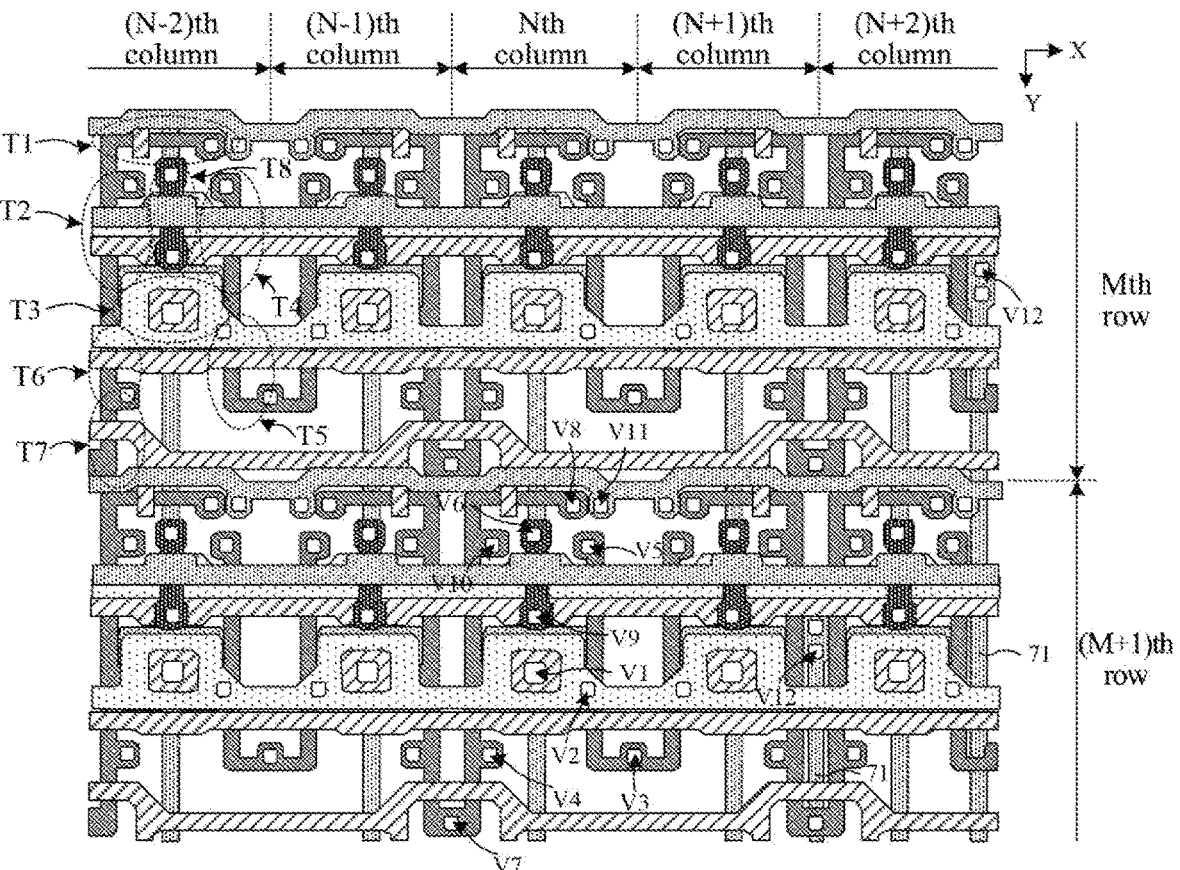
FIG. 15 is a schematic view obtained after a pattern of a sixth insulating layer is formed according to an embodiment of the present disclosure.

(7) Forming a pattern of a sixth insulating layer. In an exemplary implementation mode, forming the pattern of the sixth insulating layer may include depositing a sixth insulating thin film on the base substrate on which the aforementioned patterns are formed, patterning the sixth insulating thin film using a patterning process to form the sixth insulating layer covering the third conductive layer, and a plurality of vias are provided on the sixth insulating layer, as shown in FIG. 15.

In an exemplary implementation mode, the plurality of vias of each circuit unit at least includes a first via V1, a second via V2, a third via V3, a fourth via V4, a fifth via V5, a sixth via V6, a seventh via V7, an eighth via V8, a ninth via V9, a tenth via V10, and an eleventh via V11.

In an exemplary implementation mode, the orthographic projection of the first via V1 on the base substrate is within the range of the orthographic projection of the opening 34 on the base substrate, the sixth insulating layer, the fifth insulating layer, the fourth insulating layer and the third insulating layer in the first via V1 are etched away so as to expose the surface of the first plate 24. The first via V1 is configured to connect the second electrode of the eighth transistor T8 formed subsequently to the first plate 24 through the via V1.

In an exemplary implementation mode, the second via V2 is located within the range of the orthographic projection of the second plate 32 on the base substrate. The sixth insulating layer, the fifth insulating layer and the fourth insulating layer in the second via V2 are etched away to expose the surface of the second plate 32. The second via V2 is configured to connect the first electrode of the fifth transistor T5 formed subsequently to the second plate 32 through the via V2.

In an exemplary implementation mode, the orthographic projection of the third via V3 on the base substrate is within the range of the orthographic projection of the first zone of the fifth active layer on the base substrate, the sixth insulating layer, the fifth insulating layer, the fourth insulating layer, the third insulating layer and the second insulating layer in the third via V3 are etched away to expose the surface of the first zone of the fifth active layer, and the third via V3 is configured to connect the first electrode of the formed subsequently fifth transistor T5 to the first zone of the fifth active layer through the via V3.

In an exemplary implementation mode, the orthographic projection of the fourth via V4 on the base substrate is within the range of the orthographic projection of the second zone of the sixth active layer (also the second zone of the seventh active layer) on the base substrate, the sixth insulating layer, the fifth insulating layer, the fourth insulating layer, the third insulating layer and the second insulating layer in the fourth via V4 are etched away to expose the surface of the second zone of the sixth active layer, the fourth via V4 is configured to connect the second electrode of the sixth transistor T6 (also the second electrode of the seventh transistor T7)

formed subsequently to the second zone of the sixth active layer (also the second zone of the seventh active layer) through the via V4.

In an exemplary implementation mode, the orthographic projection of the fifth via V5 on the base substrate is within the range of the orthographic projection of the first zone of the fourth active layer on the base substrate, the sixth insulating layer, the fifth insulating layer, the fourth insulating layer, the third insulating layer and the second insulating layer in the fifth via V5 are etched away to expose the surface of the first zone of the fourth active layer, the fifth via V5 is configured to connect the first electrode of the fourth transistor T4 formed subsequently to the first zone of the fourth active layer through the via V5.

In an exemplary implementation mode, the orthographic projection of the sixth via V6 on the base substrate is within the range of the orthographic projection of the first zone of the eighth active layer on the base substrate, the sixth insulating layer and the fifth insulating layer in the sixth via V6 are etched away to expose the surface of the first zone of the eighth active layer. The sixth via V6 is configured to connect the first electrode of the eighth transistor T8 formed subsequently to the first zone of the eighth active layer through the via V6.

In an exemplary implementation mode, the orthographic projection of the seventh via V7 on the base substrate is within the range of the orthographic projection of the first zone of the seventh active layer on the base substrate, the sixth insulating layer, the fifth insulating layer, the fourth insulating layer, the third insulating layer and the second insulating layer in the seventh via V7 are etched away to expose the surface of the first zone of the seventh active layer, and the seventh via V7 is configured to connect the second initial signal line formed subsequently to the first zone of the seventh active layer through the via V7.

In an exemplary implementation mode, the orthographic projection of the eighth via V8 on the base substrate is within the range of the orthographic projection of the first zone of the first active layer on the base substrate, the sixth insulating layer, the fifth insulating layer, the fourth insulating layer, the third insulating layer and the second insulating layer in the eighth via V8 are etched away to expose the surface of the first zone of the first active layer. The eighth via V8 is configured to connect the first electrode of the first transistor T1 formed subsequently to the first zone of the first active layer through the via V8.

In an exemplary implementation mode, the orthographic projection of the ninth via V9 on the base substrate is within the range of the orthographic projection of the second zone of the eighth active layer on the base substrate, the sixth insulating layer and the fifth insulating layer in the ninth via V9 are etched away to expose the surface of the second zone of the eighth active layer. The ninth via V9 is configured to connect the second electrode of the eighth transistor T8 formed subsequently to the second zone of the eighth active layer through the via V9.

In an exemplary implementation mode, the orthographic projection of the tenth via V10 on the base substrate is within the orthographic projection of the second zone of the first active layer (also the first zone of the second active layer) on the base substrate, the sixth insulating layer, the fifth insulating layer, the fourth insulating layer, the third insulating layer and the second insulating layer in the tenth via V10 are etched away to expose the surface of the second zone of the first active layer, the tenth via V10 is configured to connect the second electrode of the first transistor T1 (also the first electrode of the second transistor T2) formed subsequently to the second zone of the first active layer (also the first zone of the second active layer) through the via V10.

In an exemplary implementation mode, the orthographic projection of the eleventh via V11 on the base substrate is within the range of the orthographic projection of the first initial signal line 42 on the base substrate, the sixth insulating layer in the eleventh via V11 is etched away to expose the surface of the first initial signal line 42. The eleventh via V11 is configured to connect the first electrode of the first transistor T1 formed subsequently to the first initial signal line 42 through the via V11.

In an exemplary implementation mode, the plurality of vias provided on the sixth insulating layer may also include a twelfth via V12, the orthographic projection of the twelfth via V12 on the base substrate is within the orthographic projection range of the first connection block 71-1 of the first connection line 71 on the base substrate, the sixth insulating layer, the fifth insulating layer, the fourth insulating layer, the third insulating layer, the second insulating layer and the first insulating layer in the twelfth via V12 are etched away to expose the surface of the first connection block 71-1, and the twelfth via V12 can be used as the first lap via in the present disclosure, and the twelfth via V12 is configured to connect the second connection line formed subsequently to the first connection block 71-1 through the via V12.

In an exemplary implementation mode, the quantity of the twelfth via V12 may be multiple, and the multiple twelfth vias V12 may be disposed sequentially along the second direction Y to increase the reliability of the connection between the first connection line and the second connection line.

Figure 16A:
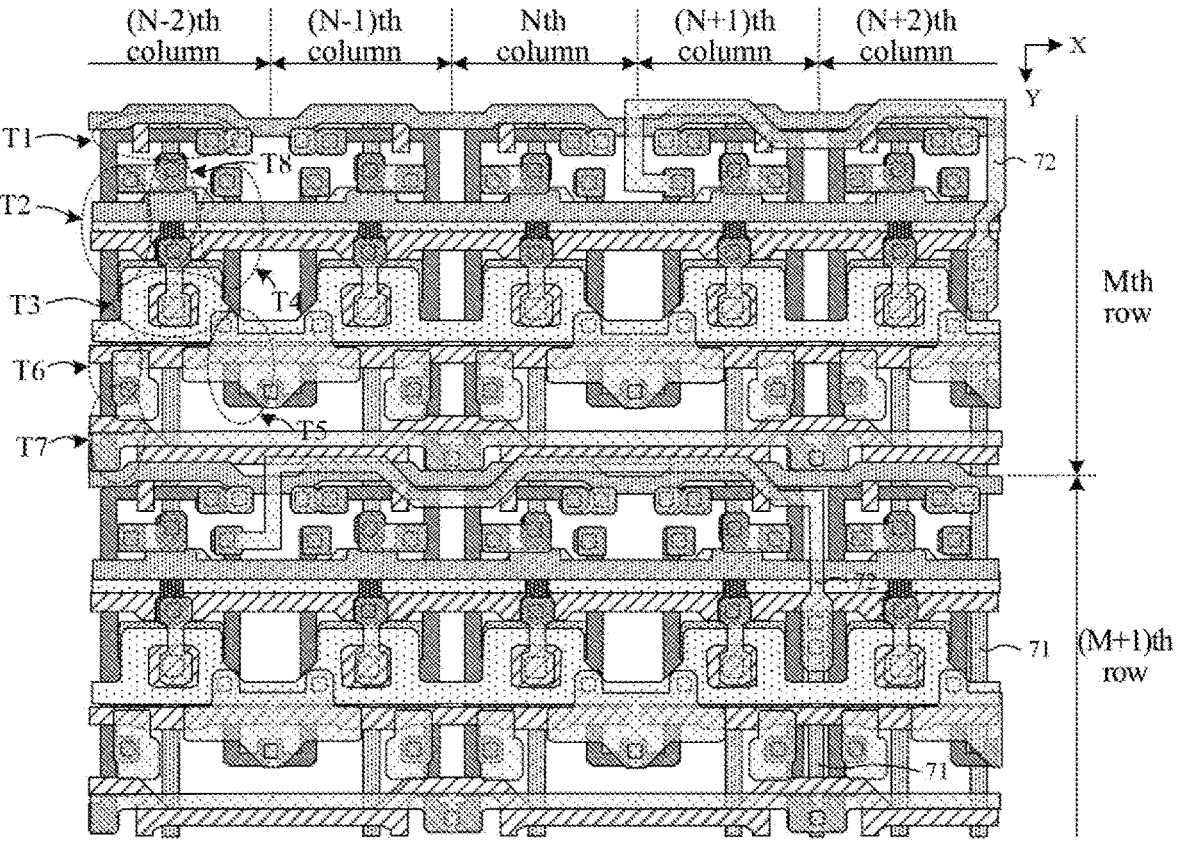
FIG. 16a and FIG. 16b are schematic diagrams obtained after a pattern of a fourth conductive layer is formed according to an embodiment of the present disclosure.
Figure 16B:
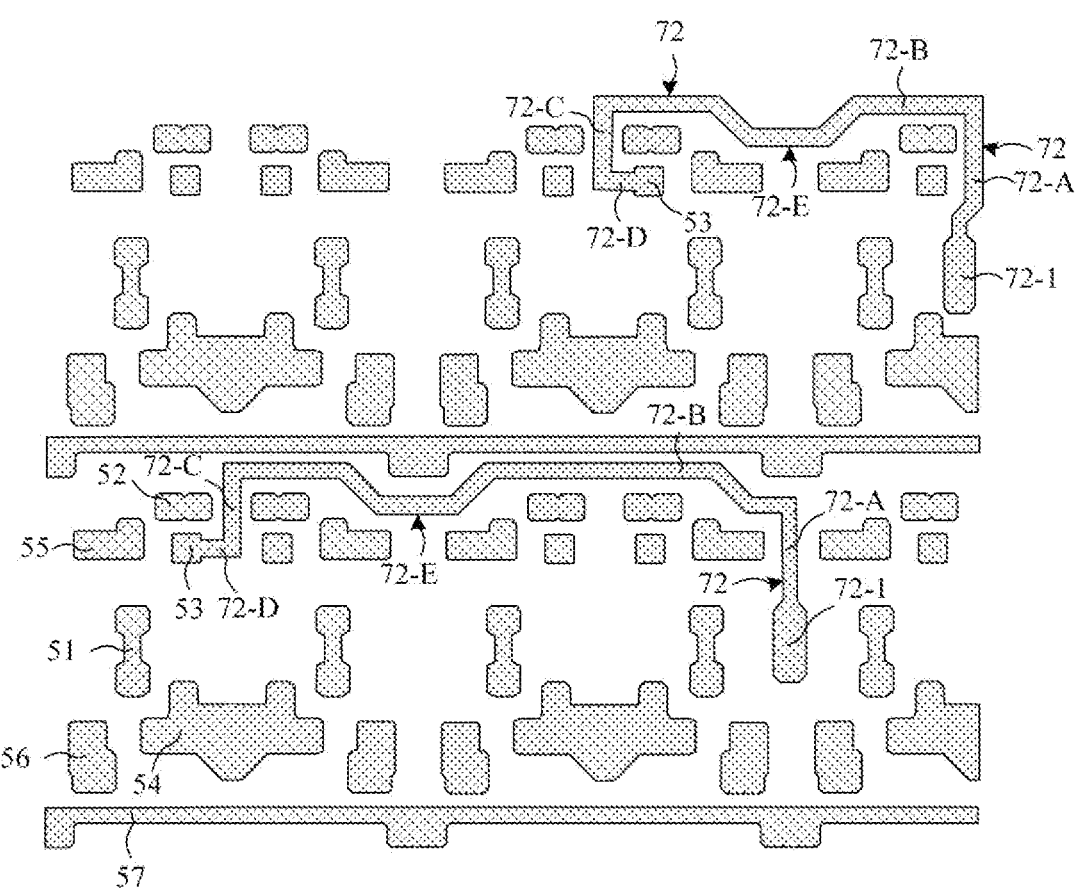

(8) Forming a pattern of a fourth conductive layer. In an exemplary implementation mode, forming the fourth conductive layer may include depositing a fourth conductive thin film on the base substrate on which the aforementioned patterns are formed, patterning the fourth conductive thin film by a patterning process to form the fourth conductive layer disposed on the sixth insulating layer, as shown in FIGS. 16a and 16b, FIG. 16b is a schematic plan view of the fourth conductive layer in FIG. 16a. In an exemplary implementation mode, the fourth conductive layer may be referred to as a first source drain metal (SD1) layer.

In an exemplary implementation mode, the fourth conductive layer of each circuit unit at least includes a first connection electrode 51, a second connection electrode 52, a third connection electrode 53, a fourth connection electrode 54, a fifth connection electrode 55, a sixth connection electrode 56, and a second initial signal line 57.

In an exemplary implementation mode, the first connection electrode 51 may have a shape of a strip with a main body portion extending in the second direction Y, the first end of the first connection electrode 51 is connected with the first plate 24 through the first via V1, and the second end of the first connection electrode 51 is connected with the second zone of the eighth active layer through the ninth via V9, so that the first plate 24 and the second electrode of the eighth transistor T8 have a same potential. In an exemplary implementation mode, the first connection electrode 51 may serve as the second electrode of the eighth transistor T8.

In an exemplary implementation mode, the second connection electrode 52 may be of a rectangular shape, the first end of the second connection electrode 52 is connected with the first initial signal line 42 through the eleventh via V11, and the second end of the second connection electrode 52 is connected with the first zone of the first active layer through the eighth via V8, so that a first initial voltage transmitted by the first initial signal line 42 is written to the first electrode of the first transistor T1. In an exemplary implementation mode, the second connection electrode 52 may serve as the first electrode of the first transistor T1.

In an exemplary implementation mode, the third connection electrode 53 may be of a rectangular shape and the third connection electrode 53 is connected with the first zone of the fourth active layer through the fifth via V5. In an exemplary implementation mode, the third connection electrode 53 may serve as the first electrode of the fourth transistor T4, and the third connection electrode 53 is configured to be connected with a data signal line formed subsequently.

In an exemplary implementation mode, the fourth connection electrode 54 may be of a multilateral shape, the first end of the fourth connection electrode 54 is connected with the second plate 32 through the second via V2, and the second end of the fourth connection electrode 54 is connected with the first zone of the fifth active layer through the third via V3. In an exemplary implementation mode, the fourth connection electrode 54 may serve as the first electrode of the fifth transistor T5, realizing that the first electrode of the fifth transistor T5 in the circuit unit and the second plate 32 of the storage capacitor have a same potential, and the fourth connection electrode 54 is configured to be connected with a first power supply line formed subsequently.

In an exemplary implementation mode, in each unit row, the fourth connection electrode 54 of the (N−2)th column and the fourth connection electrode 54 of the (N−1)th column may be interconnected to be of an integral structure, and the fourth connection electrode 54 of the Nth column and the fourth connection electrode 54 of the (N+1)th column may be interconnected to be of an integral structure. In an exemplary implementation mode, since the fourth connection electrode 54 in each circuit unit is connected with the first power supply line formed subsequently, the fourth connection electrodes 54 of adjacent circuit units are formed into an integral structure in which they are connected with each other, the fourth connection electrodes 54 of adjacent circuit units can be guaranteed to have a same potential, therefore, the first electrodes of the fifth transistors T5 in the adjacent circuit units have a same potential, and the second electrodes 32 of the storage capacitor in the adjacent circuit units have a same potential, which is beneficial for improving the uniformity of the panel, avoiding poor display of the display substrate and ensuring the display effect of the display substrate.

In an exemplary implementation mode, the fifth connection electrode 55 may be rectangular, a first end of the fifth connection electrode 55 is connected with a second zone of the first active layer through the tenth via V10, and a second end of the fifth connection electrode 55 is connected with a first zone of the eighth active layer through the sixth via V6. In an exemplary implementation mode, the fifth connection electrode 55 may simultaneously serve as the second electrode of the first transistor T1, the first electrode of the second transistor T2 and the first electrode of the eighth transistor T8.

In an exemplary implementation mode, the sixth connection electrode 56 may be rectangular, and the sixth connection electrode 56 is connected with a second zone of the sixth active layer (also a second zone of the seventh active layer) through the fourth via V4. In an exemplary implementation mode, the sixth connection electrode 56 may simultaneously serve as the second electrode of the sixth transistor T6 and the second electrode of the seventh transistor T7, and the sixth connection electrode 56 is configured to be connected with an anode connection electrode formed subsequently.

In an exemplary implementation mode, the second initial signal line 57 may have a shape of a straight line with a main body portion extending in the first direction X, and the second initial signal line 57 is connected with the first zones of a plurality of seventh active layers through a plurality of seventh vias V7 in a unit row to write a second initial voltage to a plurality of seventh transistors T7 in a unit row. In an exemplary implementation mode, since the second initial signal line 57 is connected with the first zones of all of the seventh active layers in a unit row, the first electrodes of all of the seventh transistors T7 in a unit row can be guaranteed to have a same potential, which is beneficial for improving the uniformity of the panel, avoiding poor display of the display substrate and ensuring the display effect of the display substrate.

In an exemplary implementation mode, the fourth conductive layer may also include a second connection line 72, a first end of the second connection line 72 is connected with the first connection line 71 through the twelfth via V12, and a second end of the second connection line 72 is connected with the third connection electrode 53 in a corresponding circuit unit, thereby realizing the connection between the second connection line 72 located in the fourth conductive layer and the first connection line 71 located in the shielding conductive layer.

In an exemplary implementation mode, at least one second connection line 72 may include a second connection block 72-1 and a plurality of sub-lines connected sequentially, the plurality of sub-lines may at least include a first sub-line 72-A, a second sub-line 72-B, a third sub-line 72-C, and a fourth sub-line 72-D.

In an exemplary implementation mode, the second connection block 72-1 may have a shape of a strip extending along the second direction Y and is connected with the second connection line 72, the orthographic projection of the second connection block 72-1 on the base substrate at least partially overlaps the orthographic projection of the first connection block 71-1 of the first connection line 71 on the base substrate, and the second connection block 72-1 is connected with the first connection block 71-1 through the twelfth via V12, thereby realizing the connection between the first connection line 71 and the second connection line 72.

In an exemplary implementation mode, a first end of the first sub-line 72-A is connected with the second connection block 72-1, and after extending in the opposite direction of the second direction Y, a second end of the first sub-line 72-A is connected with a first end of the second sub-line 72-B. After extending in the first direction X or the opposite direction of the first direction X, a second end of the second sub-line 72-B is connected with a first end of the third sub-line 72-C. After extending in the second direction Y, a second end of the third sub-line 72-C is connected with a first end of the fourth sub-line 72-D. After extending in the first direction X or the opposite direction of the first direction X, a second end of the fourth sub-line 72-D is connected with the third connection electrode 53.

In an exemplary implementation mode, the second connection block 72-1, the first sub-line 72-A, the second sub-line 72-B, the third sub-line 72-C, the fourth sub-line 72-D, and the third connection electrode 53 may be interconnected to be of an integral structure.

In an exemplary implementation mode, the first sub-line 72-A may be disposed between adjacent unit columns, i.e., the first sub-line 72-A may be disposed between circuit units adjacent in the first direction X.

In an exemplary implementation mode, the second sub-line 72-B may have a shape of a bending line extending in the first direction X, the orthographic projection of the second sub-line 72-B on the base substrate at least partially overlaps the orthographic projection of the second scan signal line 22 on the base substrate, and the orthographic projection of the second sub-line 72-B on the base substrate at least partially overlaps the orthographic projection of the first initial signal line 42 on the base substrate.

In an exemplary implementation mode, the second sub-line 72-B may include at least one protruding segment 72-E protruding toward the direction of the bonding region and the protruding segment 72-E may have a shape of a trapezoid.

In an exemplary implementation mode, the third sub-line 72-C may be disposed between adjacent unit columns, i.e., the third sub-line 72-C may be disposed between adjacent circuit units in the first direction X.

Figure 17:
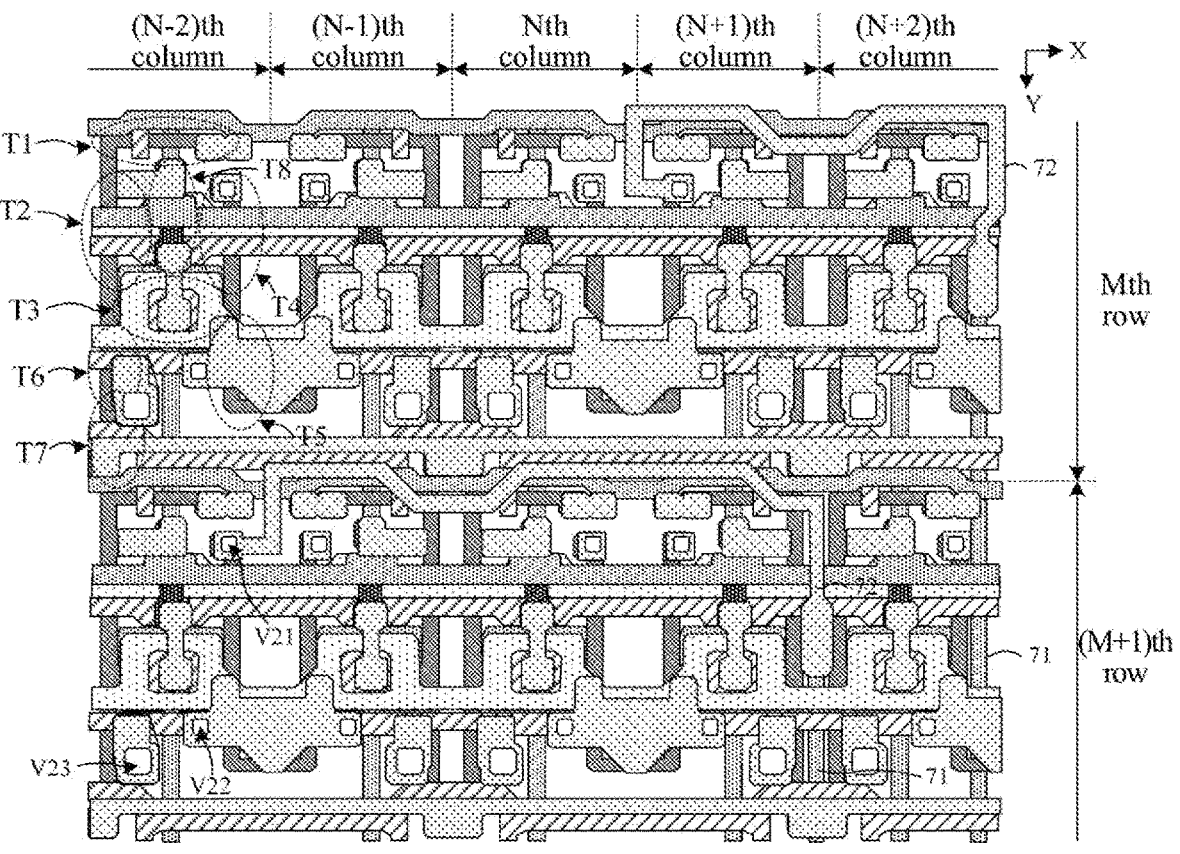
FIG. 17 is a schematic diagram obtained after a pattern of a first planarization layer is formed according to an embodiment of the present disclosure.

(9) Forming a pattern of a first planarization layer. In an exemplary implementation mode, forming the pattern of the first planarization layer may include: on the base substrate on which the aforementioned patterns are formed, depositing a seventh insulating thin film at first, then coating a first planarization thin film, and patterning the first planarization thin film and the seventh insulating thin film by a patterning process to form a seventh insulating layer covering a pattern of the fourth conductive layer and the first planarization layer provided on the seventh insulating layer, and a plurality of vias are provided on the first planarization layer, as shown in FIG. 17.

In an exemplary implementation mode, the plurality of vias in each circuit unit at least include a twenty-first via V21, a twenty-second via V22, and a twenty-third via V23.

In an exemplary implementation mode, the orthographic projection of the twenty-first via V21 on the base substrate is within the range of the orthographic projection of the third connection electrode 53 on the base substrate, the first planarization layer and the seventh insulating layer in the twenty-first via V21 are etched away to expose the surface of the third connection electrode 53. The twenty-first via V21 is configured to connect a data signal line formed subsequently to the third connection electrode 53 through the via V21, and the twenty-first via V21 can be used as the second lap via of the present disclosure.

In an exemplary implementation mode, the orthographic projection of the twenty-second via V22 on the base substrate is within the range of the orthographic projection of the fourth connection electrode 54 on the base substrate, the first planarization layer and the seventh insulating layer in the twenty-second via V22 are etched away to expose the surface of the fourth connection electrode 54. The twenty-second via V22 is configured to connect a first power supply line formed subsequently to the fourth connection electrode 54 through the via.

In an exemplary implementation mode, the orthographic projection of the twenty-third via V23 on the base substrate is within the range of the orthographic projection of the sixth connection electrode 56 on the base substrate, the first planarization layer and the seventh insulating layer in the twenty-third via V23 are etched away to expose the surface of the sixth connection electrode 56, and the twenty-third via V23 is configured to connect an anode connection electrode formed subsequently to the sixth connection electrode 56 through the via.

Figure 18A:
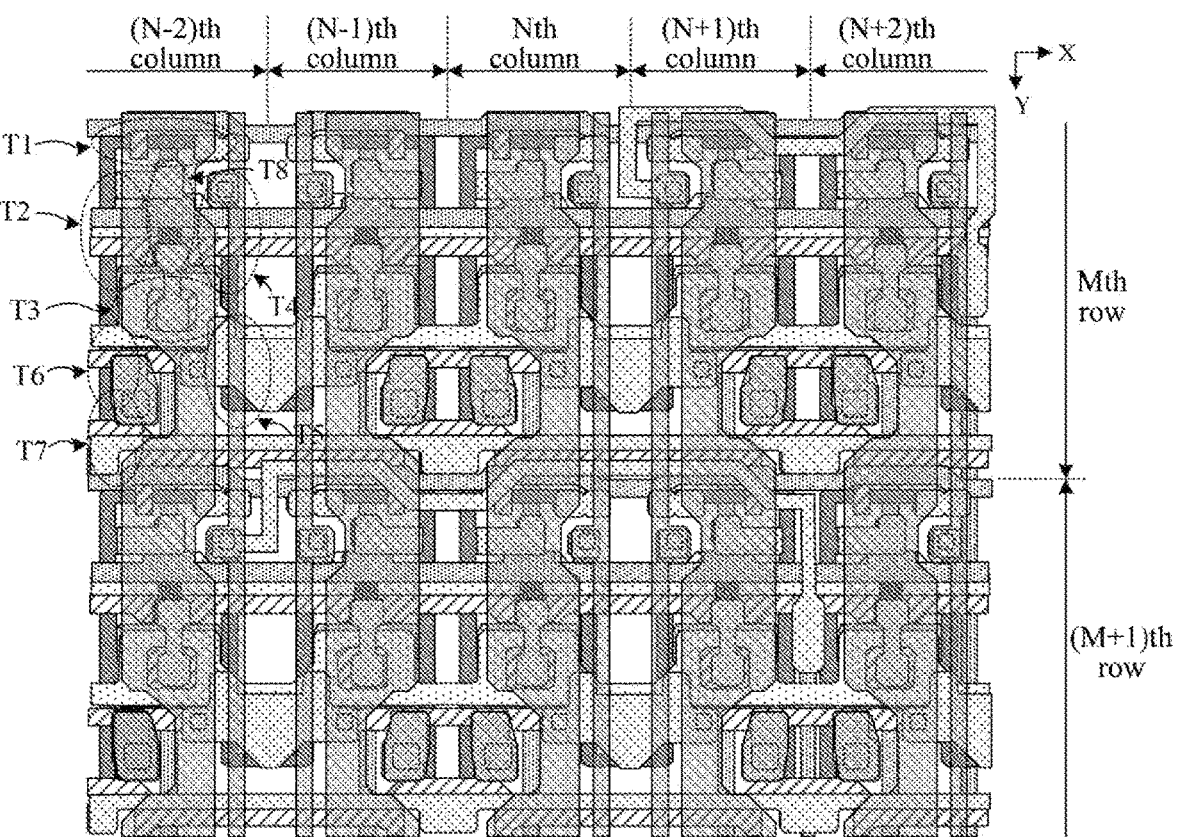
FIG. 18a to FIG. 18d are schematic diagrams after a pattern of a fifth conductive layer is formed according to an embodiment of the present disclosure.
Figure 18B:
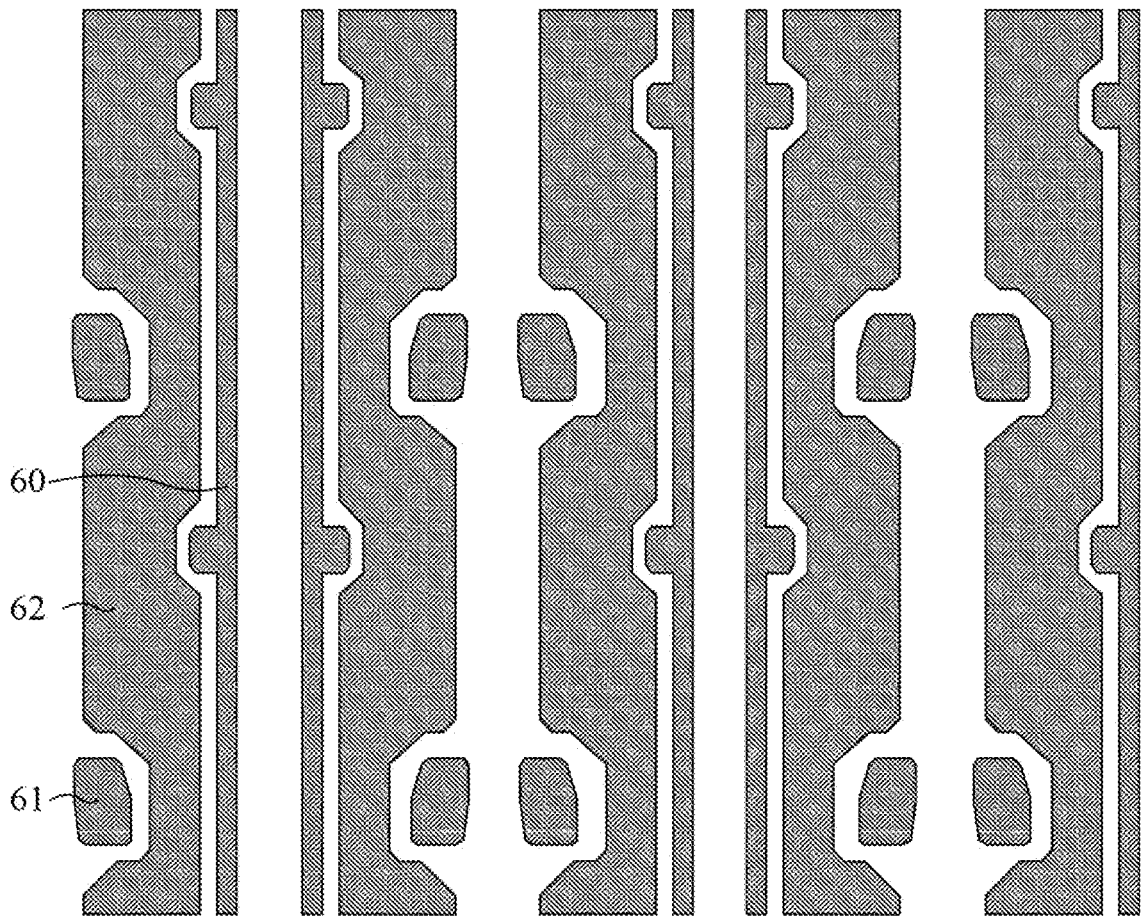
Figure 18C:
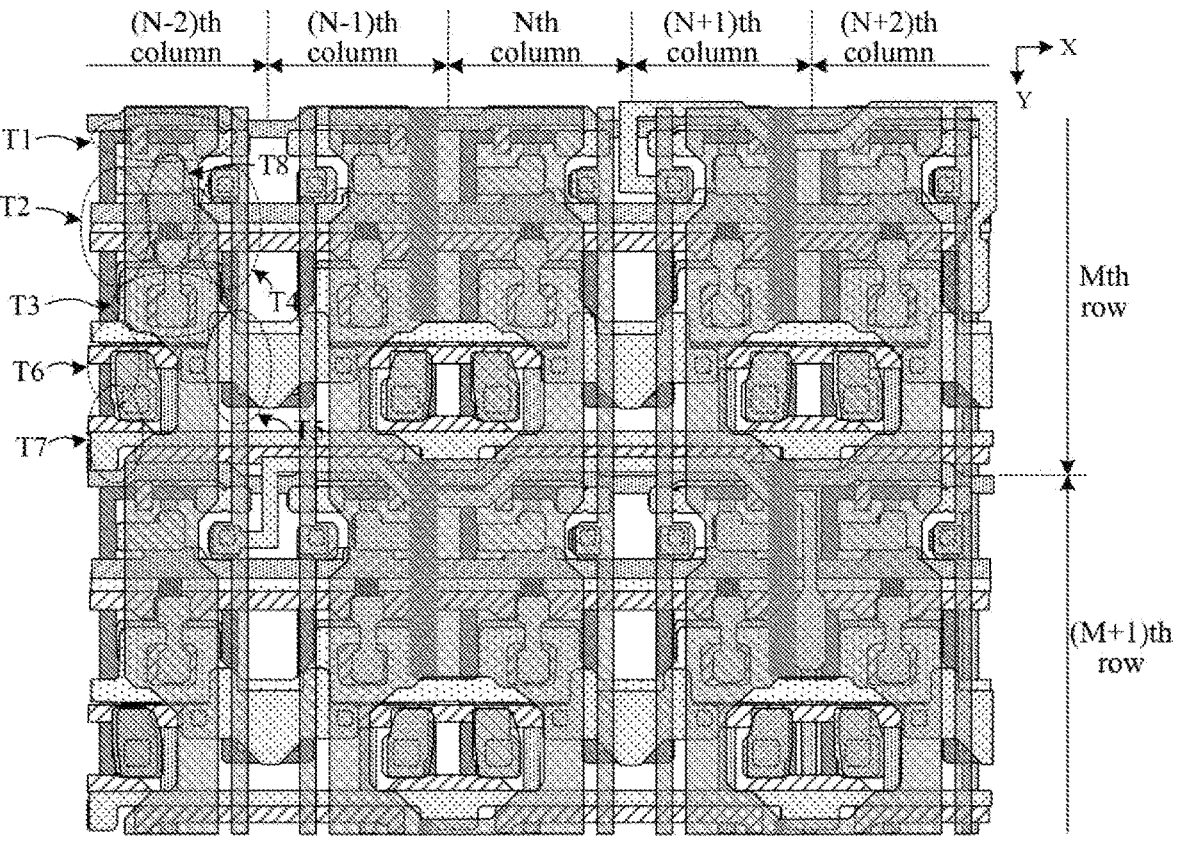
Figure 18D:
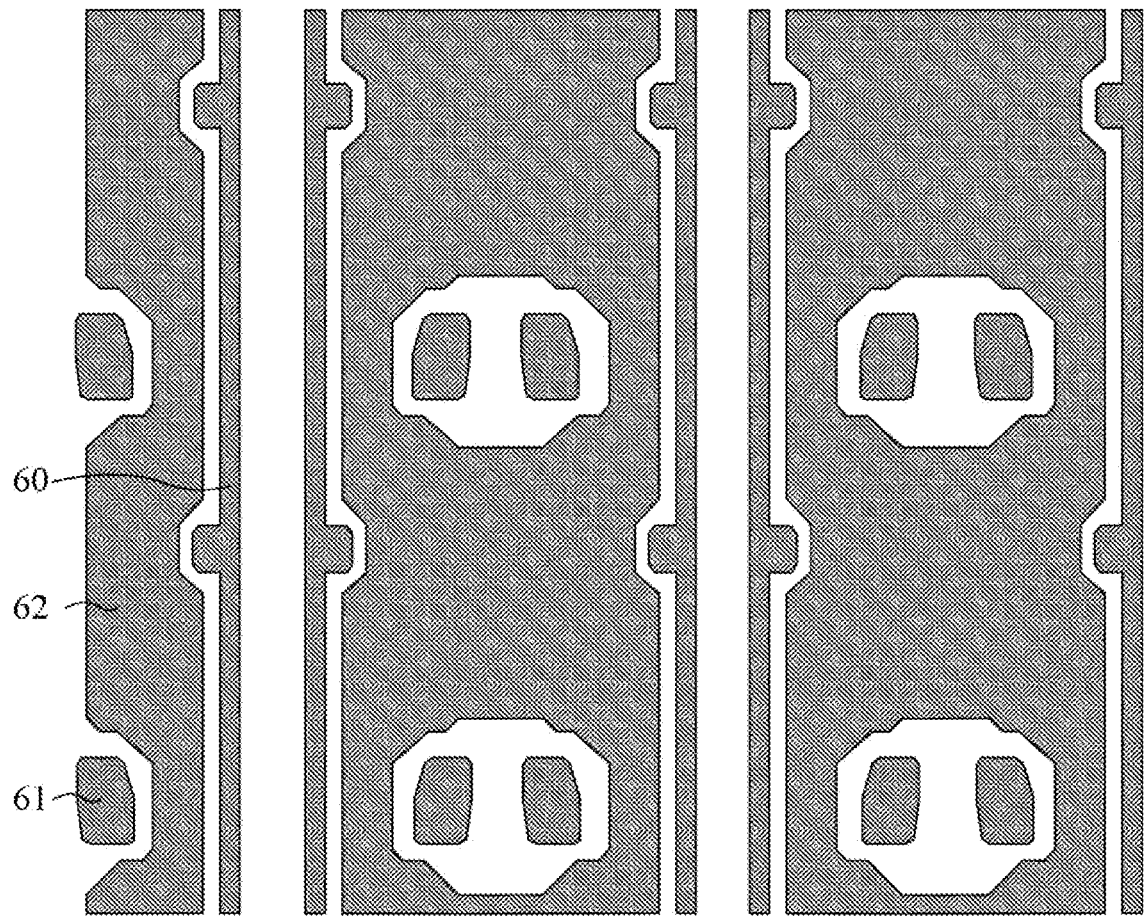

(10) Forming a pattern of a fifth conductive layer. In an exemplary implementation mode, forming the fifth conductive layer may include: on the base substrate on which the aforementioned patterns are formed, depositing a fifth conductive thin film, patterning the fifth conductive thin film by a patterning process to form a fifth conductive layer disposed on the first planarization layer, as shown in FIGS. 18a to 18d, wherein FIG. 18a is a schematic diagram after a fifth conductive layer pattern is formed, FIG. 18b is a planar schematic diagram of the fifth conductive layer in FIG. 18a, FIG. 18c is a schematic diagram after another fifth conductive layer pattern is formed, and FIG. 18d is a planar schematic diagram of the fifth conductive layer in FIG. 18c. In an exemplary embodiment, the fifth conductive layer may be referred to as a second source drain metal (SD2) layer.

As shown in FIGS. 18a and 18b, the fifth conductive layer of each circuit unit at least includes a data signal line 60, an anode connection electrode 61 and a first power supply line 62.

In an exemplary implementation mode, the data signal line 60 may have a shape of a straight line with a main body portion extending in the second direction Y and is connected with the third connection electrode 53 through the twenty-first via V21. Since the third connection electrode 53 is connected with the first zone of the fourth active layer through a via, the connection between the data signal line 60 and the first electrode of the fourth transistor T4 is realized, and the data signal line 60 can write a data signal to the first electrode of the fourth transistor T4. At the same time, in some circuit units, since the third connection electrode 53 is connected with the second connection line 72, the second connection line 72 is connected with the first connection line 71 through a via, the first connection line 71 is connected with the lead line of the bonding region, and the lead line is connected with the integrated circuit, the connection between the data signal line 60 and the integrated circuit of the bonding region through the first connection line 71, the second connection line 72 and the lead line is realized, and the integrated circuit can output a data signal to the data signal line 60.

In an exemplary implementation mode, the anode connection electrode 61 may be of a rectangular shape, the anode connection electrode 61 is connected with the sixth connection electrode 56 through the twenty-third via V23, and the anode connection electrode 61 is configured to be connected with an anode formed subsequently.

In an exemplary implementation mode, the first power supply line 62 may have a shape of a bending line with a main body portion extending along the second direction Y, and the first power supply line 62 is connected with the fourth connection electrode 54 through the twenty-second via V22. Since the fourth connection electrode 54 is respectively connected with the second plate 32 and the first zone of the fifth active layer through a via, it is realized that the first power supply line 62 can write a first power supply signal to the first electrode of the fifth transistor T5, and the first electrode of the fifth transistor T5 and the second plate of the storage capacitor have a same potential.

In an exemplary implementation mode, since the fourth connection electrodes 54 of adjacent circuit units in the unit row are interconnected to be of an integral structure, therefore, adjacent first power supply lines 62 are connected with a same fourth connection electrode 54, so that the adjacent first power supply lines 62 have a same potential, which is beneficial for improving the uniformity of the panel, avoiding poor display of the display substrate and ensuring the display effect of the display substrate.

In an exemplary implementation mode, the first power supply line 62 may be a bending line of non-equal width, which not only may facilitate the layout of a pixel structure but also may reduce the parasitic capacitance between the first power supply line and the data signal line.

In an exemplary implementation mode, the orthographic projection of the first power supply line 62 on the base substrate may at least partially overlap the orthographic projection of the first connection electrode 51 on the base substrate, so that the first power supply line 62 can be used as a shielding electrode, which can effectively shield the influence of data voltage jump on key nodes in the pixel driving circuit, avoid the influence of data voltage jump on the potential of the key nodes in the pixel driving circuit, and improve the display effect.

In an exemplary implementation mode, the orthographic projection of the first power supply line 62 on the base substrate may at least partially overlap the orthographic projection of the second connection electrode 52 on the base substrate, and the orthographic projection of the first power supply line 62 on the base substrate may at least partially overlap the orthographic projection of the fifth connection electrode 55 on the base substrate.

As shown in FIGS. 18*c* and 18*d*, the structure of the fifth conductive layer in each circuit unit is substantially similar to that shown in FIGS. 18*a* and 18*b*, except that first power supply lines 62 in two adjacent circuit units in a unit row may be connected with each other to form a first power supply line 62 of an integral structure in two unit columns. For example, the first power supply line 62 of the (N−1)th column and the first power supply line 62 of the Nth column may be interconnected to be of an integral structure. As another example, the first power supply line 62 of the (N+1)th column and the first power supply line 62 of the (N+2)th column may be interconnected to be of an integral structure. By setting the first power supply lines 62 of adjacent circuit units to be interconnected to be of an integral structure, the present disclosure can not only improve the uniformity of the panel and avoid poor display of the display substrate, but also effectively block the first lap via connecting the first connection line and the second connection line, avoid astigmatism caused by the lap via, and ensure the display quality and display effect of the display substrate.

Figure 19:
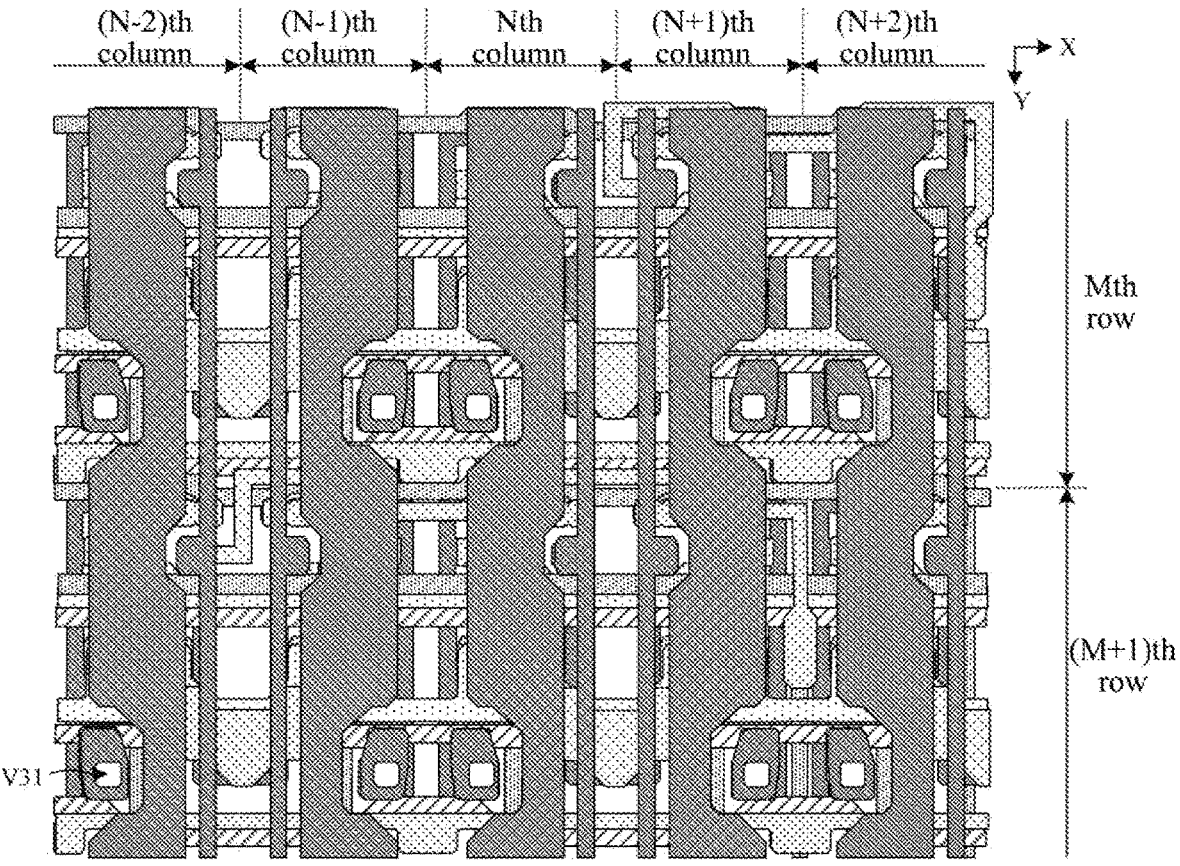
FIG. 19 is a schematic diagram after formation of a pattern of a second planarization layer according to an embodiment of the present disclosure.

(11) Forming a pattern of a second planarization layer. In an exemplary implementation mode, forming the pattern of the second planarization layer may include coating a second planarization thin film on the base substrate on which the aforementioned patterns are formed, patterning the second planarization thin film using a patterning process to form the second planarization layer covering a pattern of the fifth conductive layer, a plurality of vias are provided on the second planarization layer, as shown in FIG. 19.

In an exemplary implementation mode, vias in each circuit unit at least includes a thirty-first via V31.

In an exemplary implementation mode, the orthographic projection of the thirty-first via V31 on the base substrate is within the range of the orthographic projection of the anode connection electrode 61 on the base substrate, the second planarization layer in the thirty-first via V31 is removed to expose the surface of the anode connection electrode 61, and the thirty-first via V31 is configured to connect an anode formed subsequently to the anode connection electrode 61 through the via V31.

Hereto, the drive circuit layer is prepared on the base substrate. In a plane parallel to the display substrate, the drive circuit layer may include a plurality of circuit units, each of which may include a pixel driving circuit, and a first scan signal line, a second scan signal line, a third scan signal line, a light emitting control line, a data signal line, a first power supply line, a first initial signal line, and a second initial signal line connected to the pixel driving circuit.

In a plane perpendicular to the display substrate, the drive circuit layer may include a shielding conductive layer, a first insulating layer, a first semiconductor layer, a second insulating layer, a first conductive layer, a third insulating layer, a second conductive layer, a fourth insulating layer, a second semiconductor layer, a fifth insulating layer, a third conductive layer, a sixth insulating layer, a fourth conductive layer, a seventh insulating layer, a first planarization layer, a fifth conductive layer and a second planarization layer disposed sequentially on the base substrate. The shielding conductive layer may at least include a first connection line, the first semiconductor layer may at least include active layers of the first transistor to the seventh transistor, the first conductive layer may at least include gate electrodes of the first transistor to the seventh transistor and a first plate of the storage capacitor, the second conductive layer may at least include a second plate of the storage capacitor and a lower gate electrode of the eighth transistor, the second semiconductor layer may at least include an active layer of the eighth transistor, the third conductive layer may at least include an upper gate electrode of the eighth transistor, the fourth conductive layer may at least include a second connection line and first electrodes and second electrodes of a plurality of transistors, the second connection line is connected with the first connection line through a first lap via, and the fifth conductive layer may at least include a data signal line and a first power supply line, the data signal line is connected with the second connection line through a second lap via.

In an exemplary implementation mode, the base substrate may be a flexible base substrate, or may be a rigid base substrate. The rigid base substrate may include, but not limited to, one or more of glass and quartz. The flexible base substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible base substrate may include a first flexible material layer, a first inorganic material layer, a semiconductor layer, a second flexible material layer and a second inorganic material layer stacked on the glass carrier plate. Materials of the first flexible material layer and second flexible material layer may be polyimide (PI), polyethylene terephthalate (PET), or a polymer soft film subjected to surface treatment, etc. Materials of the first inorganic material layer and second inorganic material layer may be silicon nitride (SiNx), silicon oxide (SiOx), or the like, so as to improve water-oxygen resistance capability of the base substrate. The first inorganic material layer and second inorganic material layer are also referred to as barrier layers. A material of the semiconductor layer may be amorphous silicon (a-si).

In an exemplary embodiment, the first conductive layer, the second conductive layer, the third conductive layer, the fourth conductive layer, and the fifth conductive layer may be made of a metal material, such as any one or more of Argentum (Ag), Copper (Cu), aluminum (Al), and Molybdenum (Mo), or an alloy material of the above-mentioned metals, such as an Aluminum-Neodymium alloy (AlNd) or a Molybdenum-Niobium alloy (MoNb), and may be in a single-layer structure, or a multilayer composite structure such as Mo/Cu/Mo. The first insulating layer, the second insulating layer, the third insulating layer, the fourth insulating layer, the fifth insulating layer, the sixth insulating layer, and the seventh insulating layer may be made of any one or more of silicon oxide (SiOx), silicon nitride (SiNx), and silicon oxynitride (SiON), and may be single layers, multiple layers, or composite layers. The first insulating layer may be referred to as a buffer layer, the second insulating layer, the third insulating layer, the fourth insulating layer and the fifth insulating layer may be referred to as a gate insulating (GI) layer, the sixth insulating layer may be referred to as an interlayer dielectric (ILD) layer, and the seventh insulating layer may be referred to as a passivation (PVX) layer. The first planarization layer and the second planarization layer may be made of an organic material such as a resin.

In an exemplary implementation mode, pixel driving circuits in two adjacent circuit units in a unit row may be substantially mirror symmetrical with respect to a first center line, which is a straight line located between two adjacent circuit units and extending in the second direction Y. For example, the pixel driving circuit of the (N−1)th column and the pixel driving circuit of the Nth column may be mirror symmetrical with respect to the first center line. As another example, the pixel driving circuit of the Nth column and the pixel driving circuit of the (N+1)th column may be mirror symmetrical with respect to the first center line.

In an exemplary implementation mode, that pixel driving circuits in two adjacent circuit units may be substantially mirror symmetrical with respect to the first center line may include any one or more of the following: the first semiconductor layers in two adjacent circuit units in a unit row may be mirror symmetrical with respect to the first center line, the first conductive layers in two adjacent circuit units in a unit row may be mirror symmetrical with respect to a first center line, the second conductive layers in two adjacent circuit units in a unit row may be mirror symmetrical with respect to the first center line, the second semiconductor layers in two adjacent circuit units in a unit row may be mirror symmetrical with respect to the first center line, the third conductive layers in two adjacent circuit units in a unit row may be mirror symmetrical with respect to the first center line, and the fifth conductive layers in two adjacent circuit units in a unit row may be mirror symmetrical with respect to the first center line.

In an exemplary implementation mode, except for the first connection line, the shielding conductive layers in two adjacent circuit units in a unit row may be mirror symmetrical with respect to the first centerline. Except for the second connection line, the fourth conductive layers in two adjacent circuit units in a unit row may be mirror symmetrical with respect to the first center line.

In an exemplary implementation mode, after the drive circuit layer is prepared, a light emitting structure layer may be prepared on the drive circuit layer, and the preparation process of the light emitting structure layer may include the following operations.

Figure 20A:
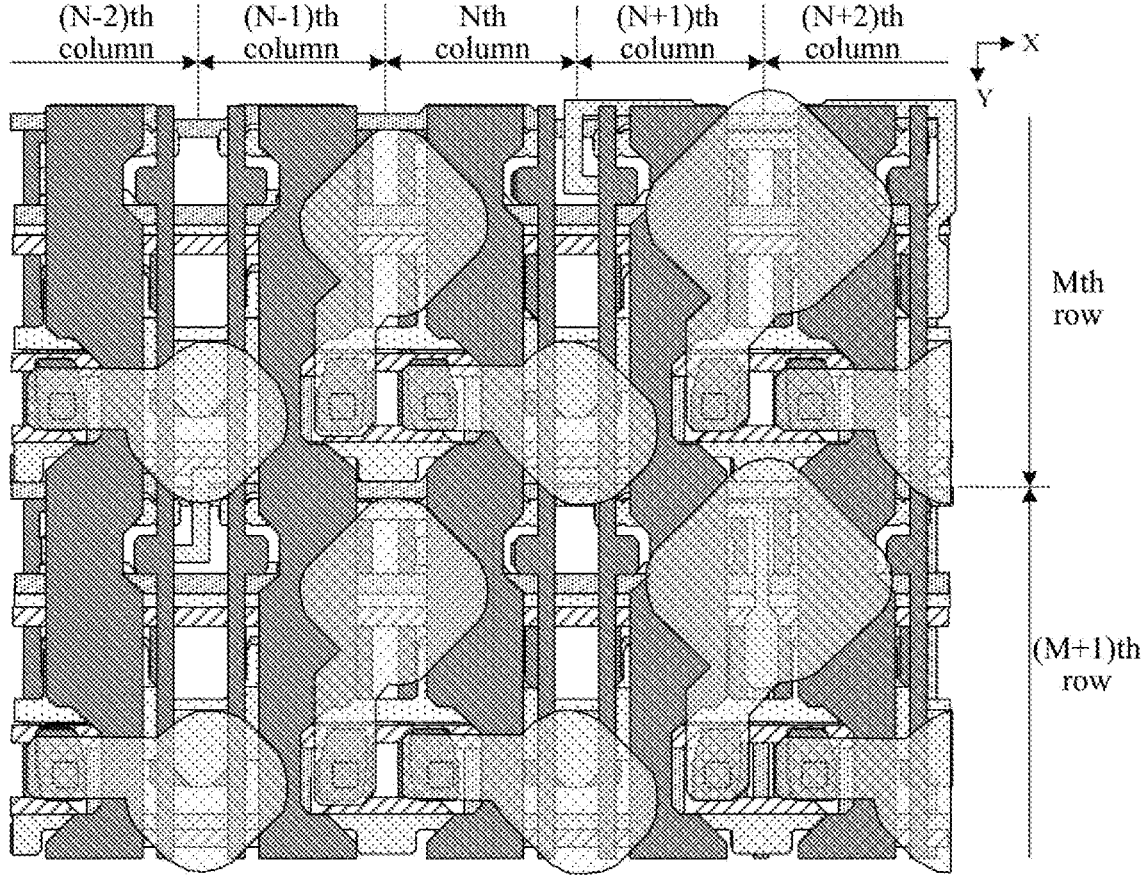
FIG. 20*a* and FIG. 20*b* are schematic diagrams obtained after a pattern of an anode conductive layer is formed according to an exemplary embodiment of the present disclosure.
Figure 20B:
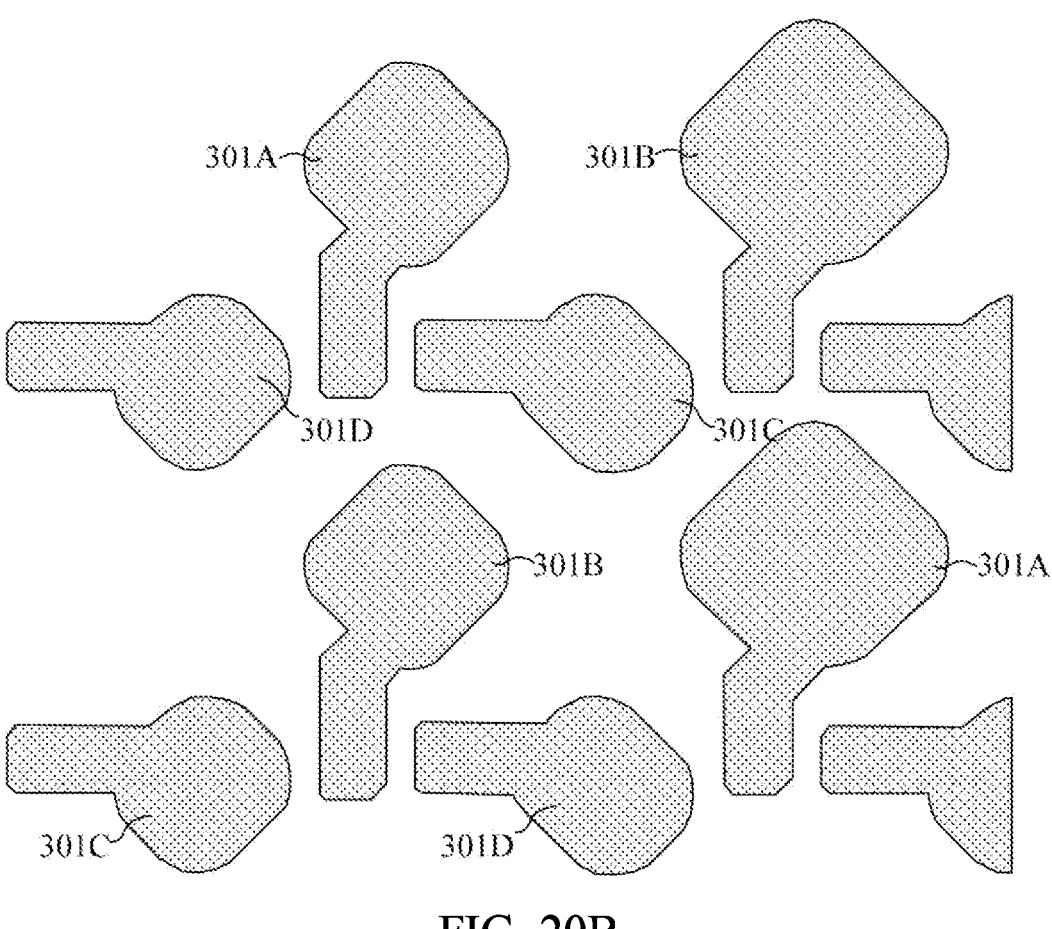

(12) Forming a pattern of an anode conductive layer. In an exemplary implementation mode, forming a pattern of an anode conductive layer may include: depositing an anode conductive thin film on the base substrate on which the aforementioned patterns are formed, and patterning the anode conductive thin film through a patterning process to form an anode conductive layer disposed on the third planarization layer, wherein the anode conductive layer may at least includes a plurality of anode patterns, as shown in FIG. 20a and FIG. 20b, and FIG. 20b is a planar schematic diagram of the anode conductive layer in FIG. 20a.

In an exemplary implementation mode, the anode conductive layer may be a single-layer structure, such as Indium Tin Oxide (ITO) or Indium Zinc Oxide (IZO), or may adopt a multi-layer composite structure, such as ITO/Ag/ITO.

In an exemplary implementation mode, the plurality of anode patterns may include a first anode 301A of a red light emitting device, a second anode 301B of a blue light emitting device, a third anode 301C of a first green light emitting device, and a fourth anode 301D of a second green light emitting device. The first anode 301A may be located at a red sub-pixel emitting red light, the second anode 301B may be located at a blue sub-pixel emitting blue light, the third anode 301C may be located at a first green sub-pixel emitting green light, and the fourth anode 301D may be located at a second green sub-pixel emitting green light.

In an exemplary implementation mode, the first anode 301A and the second anode 301B may be sequentially disposed along the first direction X, the third anode 301C and the fourth anode 301D may be sequentially disposed along the first direction X, and the third 301C anode and the fourth anode 301D may be disposed on a side of the first anode 301A and the second anode 301B in the second direction Y. Alternatively, the first anode 301A and the second anode 301B may be sequentially disposed along the second direction Y, the third anode 301C and the fourth anode 301D may be sequentially disposed along the second direction Y, and the third anode 301C and the fourth anode 301D may be disposed on a side of the first anode 301A and the second anode 301B in the first direction X.

In an exemplary implementation mode, the first anode 301A, the second anode 301B, the third anode 301C, and the fourth anode 301D may be respectively connected to the anode connection electrode 61 of a corresponding circuit unit through the thirty-first via V31, and shapes and areas of the anodes of four sub-pixels in one pixel unit may be the same or may be different.

In an exemplary implementation mode, at least one of the first anode 301A, the second anode 301B, the third anode 301C, and the fourth anode 301D may include an anode main body portion and an anode connection portion connected with each other, the anode main body portion may have a rectangular shape, the corner portion of the rectangular shape may be provided with an arc-shaped chamfer, and the anode connection portion may have a shape of a strip extending in the first direction X or the second direction Y, and the anode connection portion is connected with the anode connection electrode 61 through the thirty-first via V31. Since the anode connection electrode 61 is connected with the second zone of the sixth active layer (also the second zone of the seventh active layer) through a via, the connection between the anode and the second electrode of the sixth transistor T6 and the second electrode of the seventh transistor T7 can be realized.

In an exemplary implementation mode, the position and shape of a corresponding anode can be adaptively adjusted according to the position of the lap via, and the lap via can be effectively shielded by the anode to avoid astigmatism caused by the lap via. For example, for some first lap vias that cannot be blocked by the first power supply line, the position and shape of the anode in a region where the first lap via is located can be adjusted, and a shielding protrusion is disposed on the anode, the shielding protrusion extends towards the position where the first lap via is located, and the orthographic projection of the shielding protrusion on the base substrate includes the orthographic projection of the first lap via on the base substrate, thus realizing shielding of the first lap via.

In an exemplary implementation mode, a subsequent preparation process may include: forming a pattern of a pixel definition layer at first, then forming an organic light emitting layer using an evaporation process and inkjet printing process, then forming a cathode on the organic light emitting layer, and then forming an encapsulation structure layer, wherein the encapsulation structure layer may include a first encapsulation layer, a second encapsulation layer and a third encapsulation layer which are stacked, the first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting device.

A display substrate using a FIAA structure requires the addition of a third source-drain metal layer (SD3) and the provision of the first connection line and the second connection line in the third source-drain metal layer. It is found that the first connection line and the second connection line inevitably overlap the anode, so that the flatness of the anode in each region is inconsistent, and there is a anode height difference, which will not only lead to color deviation in large viewing angle, but also lead to undesirable effects such as screen-off watermark.

In a display substrate according to the present disclosure, the first connection line is disposed in the shielding conductive layer, the second connection line is disposed in the fourth conductive layer, the data signal line is disposed in the fifth conductive layer, the data signal line is connected with the second connection line through a via, the second connection line is connected with the first connection line through a via, it is realized that the integrated circuit can provide a data signal to the data signal line through the first connection line and the second connection line, which can effectively reduce the width of the lead region in the bonding region, can effectively reduce the width of the lower bezel, and is beneficial to realizing a full screen. According to an exemplary embodiment of the present disclosure, the first connection line is disposed in the shielding conductive layer, the second connection line is disposed in the fourth conductive layer, as a plurality of inorganic insulating layers and two planarization layers are provided between the first connection line and the anode, at least two planarization layers are provided between the second connection line and the anode, the planarization layer of an organic material is relatively thick, the first connection line and the second connection line therefore do not affect the flatness of the anode, the anode height difference can be avoided, the light emitting performance of the light emitting devices in each region can be guaranteed to be substantially the same, not only the color deviation in large viewing angle is avoided, but also the defects such as screen-off watermark are avoided, and the quality of the display substrate is improved. An exemplary embodiment of the present disclosure does not require the provision of a third source-drain metal layer, which not only simplifies the structure of the display substrate, but also saves two patterning processes (third source-drain metal layer patterning and third flatness patterning), and maximizes production cost savings. The preparation process in the present disclosure may be compatible well with an existing preparation process, which is simple in process implementation, easy to implement, high in production efficiency and yield, and low in production cost.

The structure shown in the present disclosure and the preparation process thereof are merely exemplary description. In an exemplary implementation mode, corresponding structures may be changed and patterning processes may be added or reduced according to actual needs, which is not limited here in the present disclosure.

In an exemplary implementation mode, the display substrate of the present disclosure may be applied to other display devices having pixel driving circuits, such as quantum-dot displays and the like, which is not limited in the present disclosure.

The present disclosure further provides a preparation method for a display substrate, for preparing the display substrate according to the foregoing embodiments. In an exemplary implementation mode, in a plane parallel to the display substrate, the display substrate includes a plurality of circuit units forming a plurality of unit rows and a plurality of unit columns, at least one circuit unit includes a pixel driving circuit, the preparation method may include following operations.

Forming a shielding conductive layer on the base substrate, wherein the shielding conductive layer at least includes a first connection line;

Forming a functional structure layer on the shielding conductive layer, the functional structure layer at least includes a second connection line and a data signal line, the data signal line is connected with a plurality of pixel driving circuits of one unit column, the data signal line is configured to provide a data signal to the pixel driving circuits, the second connection line is connected with the first connection line, and the data signal line is connected with the second connection line.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present disclosure are not limited thereto.

Although the implementations disclosed in the present disclosure are described as above, the described contents are only implementations which are used for facilitating the understanding of the present disclosure, but are not intended to limit the present disclosure. Any skilled person in the art to which the present disclosure pertains may make any modifications and variations in forms and details of implementation without departing from the spirit and scope of the present disclosure. However, the patent protection scope of the present disclosure should be subject to the scope defined by the appended claims.

The invention claimed is:

1. A display substrate comprising a shielding conductive layer disposed on a base substrate and a functional structure layer disposed on a side of the shielding conductive layer away from the base substrate, the shielding conductive layer at least comprising a first connection line, the functional structure layer at least comprising a data signal line and a second connection line; in a plane parallel to the display substrate, the display substrate comprising a plurality of circuit units forming a plurality of unit rows and a plurality of unit columns, at least one circuit unit comprising a pixel driving circuit, the data signal line being connected with a plurality of pixel driving circuits of one unit column, the data signal line being configured to provide a data signal to the pixel driving circuit; the second connection line being connected with the first connection line, and the data signal line being connected with the second connection line, wherein the second connection line at least comprises a first sub-line, a second sub-line, a third sub-line and a fourth sub-line, a first end of the first sub-line is connected with a second end of the first connection line, after a second end of the first sub-line extends in a direction of the unit columns, the second end of the first sub-line is connected with a first end of the second sub-line, after a second end of the second sub-line extends in a direction of the unit rows, the second end of the second sub-line is connected with a first end of the third sub-line, after a second end of the third sub-line extends in the direction of the unit columns, the second end of the third sub-line is connected with a first end of the fourth sub-line, and after a second end of the fourth sub-line extends in the direction of the unit rows, the second end of the fourth sub-line is connected with the data signal line, wherein in the plane parallel to the display substrate, the display substrate comprises a display region and a bonding region located on a side of the display region in a second direction, the second sub-line has a shape of a bending line extending in the direction of the unit rows, and the second sub-line comprises at least one protruding segment protruding toward a direction of the bonding region.

2. The display substrate according to claim 1, wherein the functional structure layer comprises a plurality of conductive layers, the second connection line and the data signal line are disposed in different conductive layers, the second connection line is connected with the first connection line through a first lap via, and the data signal line is connected with the second connection line through a second lap via.

3. The display substrate according to claim 2, wherein the bonding region at least comprises a lead line; a first end of the first connection line is connected with the lead line, after a second end of the first connection line extends to the display region, the second end of the first connection line is connected with a first end of the second connection line through the first lap via, after a second end of the second connection line extends in a first direction, the second end of the second connection line is connected with the data signal line through the second lap via, and the first direction intersects the second direction.

4. The display substrate according to claim 3, wherein an end of the first connection line close to the second connection line is provided with a first connection block, an orthographic projection of the first connection block on the base substrate at least partially overlaps an orthographic projection of the second connection line on the base substrate, and the second connection line is connected with the first connection block through the first lap via.

5. The display substrate according to claim 3, wherein an end of the second connection line close to the first connection line is provided with a second connection block, an orthographic projection of the second connection block on the base substrate at least partially overlaps an orthographic projection of the first connection line on the base substrate, and the second connection block is connected with the first connection line through the first lap via.

6. The display substrate according to claim 3, wherein an end of the first connection line close to the second connection line is provided with a first connection block, an orthographic projection of the first connection block on the base substrate at least partially overlaps an orthographic projection of a second connection block on the base substrate, and the second connection block is connected with the first connection block through the first lap via.

7. The display substrate according to claim 1, wherein the first sub-line is disposed between adjacent unit columns.

8. The display substrate according to claim 1, wherein the third sub-line is disposed between adjacent unit columns.

9. The display substrate according to claim 1, wherein the pixel driving circuit at least comprises a data writing transistor, the functional structure layer further comprises a first electrode of the data writing transistor, in the at least one circuit unit, the fourth sub-line is connected with the first electrode of the data writing transistor.

10. The display substrate according to claim 9, wherein the fourth sub-line and the first electrode of the data writing transistor are disposed in a same layer and are interconnected to be of an integral structure.

11. The display substrate according to claim 1, wherein the functional structure layer further comprises a first initial signal line configured to provide a first initial signal to the pixel driving circuit, and an orthographic projection of the second sub-line on the base substrate at least partially overlaps an orthographic projection of the first initial signal line on the base substrate.

12. The display substrate according to claim 1, wherein the first connection line is disposed between adjacent unit columns.

13. The display substrate according to claim 1, wherein the shielding conductive layer further comprises a shielding electrode disposed in the at least one circuit unit and a first shielding connection line connected to a plurality of shielding electrodes in one unit column.

14. The display substrate according to claim 1, wherein the shielding conductive layer comprises a first titanium layer having a thickness of 40 nm to 60 nm, an aluminum layer having a thickness of 250 nm to 550 nm, and a second titanium layer having a thickness of 20 nm to 40 nm, which are stacked.

15. The display substrate according to claim 1, wherein the pixel driving circuit comprises a storage capacitor and a plurality of transistors; in a plane perpendicular to the display substrate, the functional structure layer at least comprises a first conductive layer, a second conductive layer, a third conductive layer, a fourth conductive layer and a fifth conductive layer disposed on a side of the shielding conductive layer away from the base substrate, the first conductive layer at least comprises a first plate of the storage capacitor and gate electrodes of the plurality of transistors, the second conductive layer at least comprises a second plate of the storage capacitor, the fourth conductive layer at least comprises the second connection line, and the fifth conductive layer at least comprises the data signal line.

16. The display substrate according to claim 15, wherein the plurality of transistors comprise at least one polysilicon transistor and at least one oxide transistor, the functional structure layer further comprises a first semiconductor layer and a second semiconductor layer, the first semiconductor layer is disposed between the shielding conductive layer and the first conductive layer, the first semiconductor layer comprises an active layer of the polysilicon transistor, and the second semiconductor layer is disposed between the second conductive layer and the third conductive layer, the second semiconductor layer comprises an active layer of the oxide transistor.

17. A display apparatus comprising the display substrate according to claim 1.

18. A preparation method of a display substrate, in a plane parallel to the display substrate, the display substrate comprising a plurality of circuit units forming a plurality of unit rows and a plurality of unit columns, at least one circuit unit comprises a pixel driving circuit, the preparation method comprising:

forming a shielding conductive layer on a base substrate, wherein the shielding conductive layer at least comprises a first connection line;

forming a functional structure layer on the shielding conductive layer, wherein the functional structure layer at least comprises a second connection line and a data signal line, the data signal line is connected to a plurality of pixel driving circuits of one unit column, the data signal line is configured to provide a data signal to the pixel driving circuits, the second connection line is connected to the first connection line, and the data signal line is connected to the second connection line, wherein the second connection line at least comprises a first sub-line, a second sub-line, a third sub-line and a fourth sub-line, a first end of the first sub-line is connected with a second end of the first connection line, after a second end of the first sub-line extends in a direction of the unit columns, the second end of the first sub-line is connected with a first end of the second sub-line, after a second end of the second sub-line extends in a direction of the unit rows, the second end of the second sub-line is connected with a first end of the third sub-line, after a second end of the third sub-line extends in the direction of the unit columns, the second end of the third sub-line is connected with a first end of the fourth sub-line, and after a second end of the fourth sub-line extends in the direction of the unit rows, the second end of the fourth sub-line is connected with the data signal line, wherein in the plane parallel to the display substrate, the display substrate comprises a display region and a bonding region located on a side of the display region in a second direction, the second sub-line has a shape of a bending line extending in the direction of the unit rows, and the second sub-line comprises at least one protruding segment protruding toward a direction of the bonding region.

* * * * *